US012324233B2

(12) United States Patent
Bae et al.

(10) Patent No.: US 12,324,233 B2
(45) Date of Patent: Jun. 3, 2025

(54) SEMICONDUCTOR DEVICE

(71) Applicant: SAMSUNG ELECTRONICS CO., LTD., Suwon-si (KR)

(72) Inventors: Su Young Bae, Daegu (KR); Jong Ho Park, Suwon-si (KR); Dong Soo Lee, Gunpo-si (KR); Wan Don Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 215 days.

(21) Appl. No.: 17/219,083

(22) Filed: Mar. 31, 2021

(65) Prior Publication Data

US 2022/0059533 A1 Feb. 24, 2022

(30) Foreign Application Priority Data

Aug. 21, 2020 (KR) .................. 10-2020-0105130

(51) Int. Cl.
*H10D 84/85* (2025.01)
*H10D 84/01* (2025.01)
*H10D 84/03* (2025.01)

(52) U.S. Cl.
CPC ......... *H10D 84/85* (2025.01); *H10D 84/0179* (2025.01); *H10D 84/0181* (2025.01); *H10D 84/038* (2025.01)

(58) Field of Classification Search
CPC . H01L 21/8238–823892; H01L 27/092–0928; H01L 29/42392;

(Continued)

(56) References Cited

U.S. PATENT DOCUMENTS 9,379,023 B2 6/2016 Lee et al.
9,548,304 B2 1/2017 Ji et al.
(Continued)

FOREIGN PATENT DOCUMENTS

CN 111146279 A 5/2020
KR 10-2011-0135086 A 12/2011
(Continued)

OTHER PUBLICATIONS

Office Action dated Jan. 16, 2025 in corresponding Korean Patent Application No. 10-2020-0105130, in Korean, 13 pages.

(Continued)

*Primary Examiner* — Bryan R Junge
(74) *Attorney, Agent, or Firm* — MORGAN, LEWIS & BOCKIUS LLP

(57) ABSTRACT

A semiconductor device includes first and second active patterns disposed on a substrate, a field insulating film disposed between the first and second active patterns, a first gate structure intersecting the first active pattern, and a second gate structure intersecting the second active pattern, in which the first gate structure includes a first gate insulating film on the first active pattern, a first upper insertion film on the first gate insulating film, and a first upper conductive film on the first upper insertion film, and the second gate structure includes a second gate insulating film on the second active pattern, a second upper insertion film on the second gate insulating film, and a second upper conductive film on the second upper insertion film. Each of the first and second upper insertion films may include an aluminum nitride film. Each of the first and second upper conductive films may include aluminum.

15 Claims, 27 Drawing Sheets

(58) Field of Classification Search
CPC ........ H10D 30/019–0198; H10D 30/501–509; H10D 64/517; H10D 84/0172–0179; H10D 84/85; H10D 84/851; H10D 84/852; H10D 84/856

See application file for complete search history.

(56) References Cited

U.S. PATENT DOCUMENTS

| | | | |
|---|---|---|---|
| 9,997,519 B1* | 6/2018 | Bao | H01L 27/092 |
| 10,510,617 B2 | 12/2019 | Gluschenkov et al. | |
| 10,510,621 B2 | 12/2019 | Chen et al. | |
| 2010/0317181 A1* | 12/2010 | Chung | H01L 21/823857 438/585 |
| 2013/0299913 A1* | 11/2013 | Lin | H01L 21/823857 257/369 |
| 2018/0108745 A1* | 4/2018 | Li | H01L 21/28088 |
| 2018/0374926 A1* | 12/2018 | Lee | H01L 27/1251 |
| 2019/0371903 A1* | 12/2019 | Bao | H01L 21/28185 |
| 2020/0043808 A1* | 2/2020 | Bao | H01L 21/28088 |
| 2020/0051979 A1 | 2/2020 | Ando et al. | |
| 2020/0119164 A1 | 4/2020 | Tsau et al. | |
| 2020/0144255 A1 | 5/2020 | Lee et al. | |
| 2021/0098456 A1* | 4/2021 | Huang | H01L 21/823857 |
| 2021/0098581 A1* | 4/2021 | Lin | H01L 29/7851 |
| 2021/0134950 A1* | 5/2021 | Hsu | H01L 21/31111 |
| 2021/0366783 A1* | 11/2021 | Chu | H10D 30/024 |

FOREIGN PATENT DOCUMENTS

| | | |
|---|---|---|
| KR | 10-2016-0095399 | 8/2016 |
| KR | 10-2019-0000965 A | 1/2019 |
| KR | 10-2019-0056280 | 5/2019 |

OTHER PUBLICATIONS

Office Action dated Apr. 16, 2025 issued in corresponding Taiwanese Patent Application No. 110125615. (Note: US 2018/0374926 A1, US 2019/0371903 A1, US 2020/0043808 A1, and U.S. Pat. No. 9,997,519 B1 already submitted.).

* cited by examiner

FIG. 1
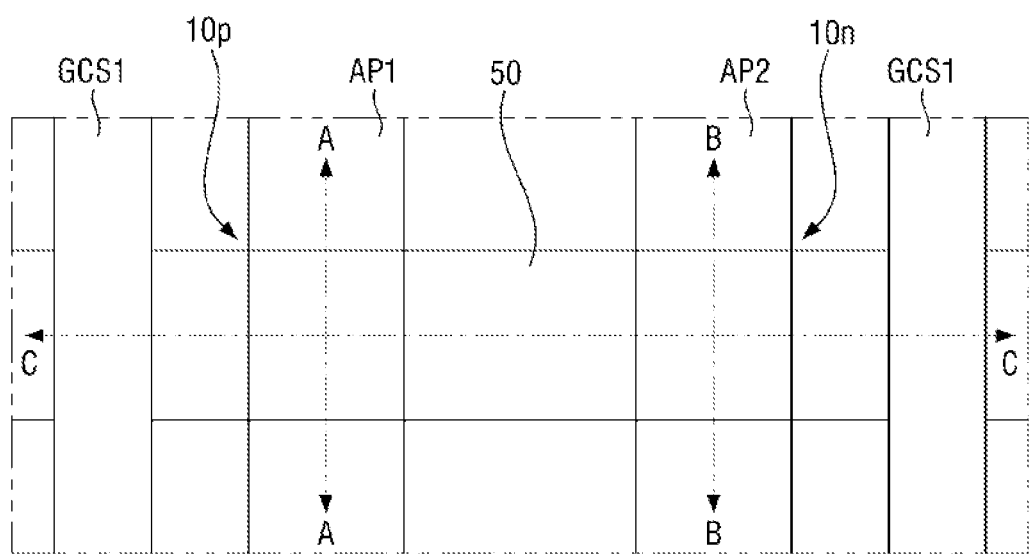
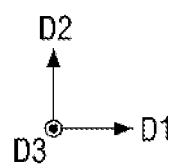

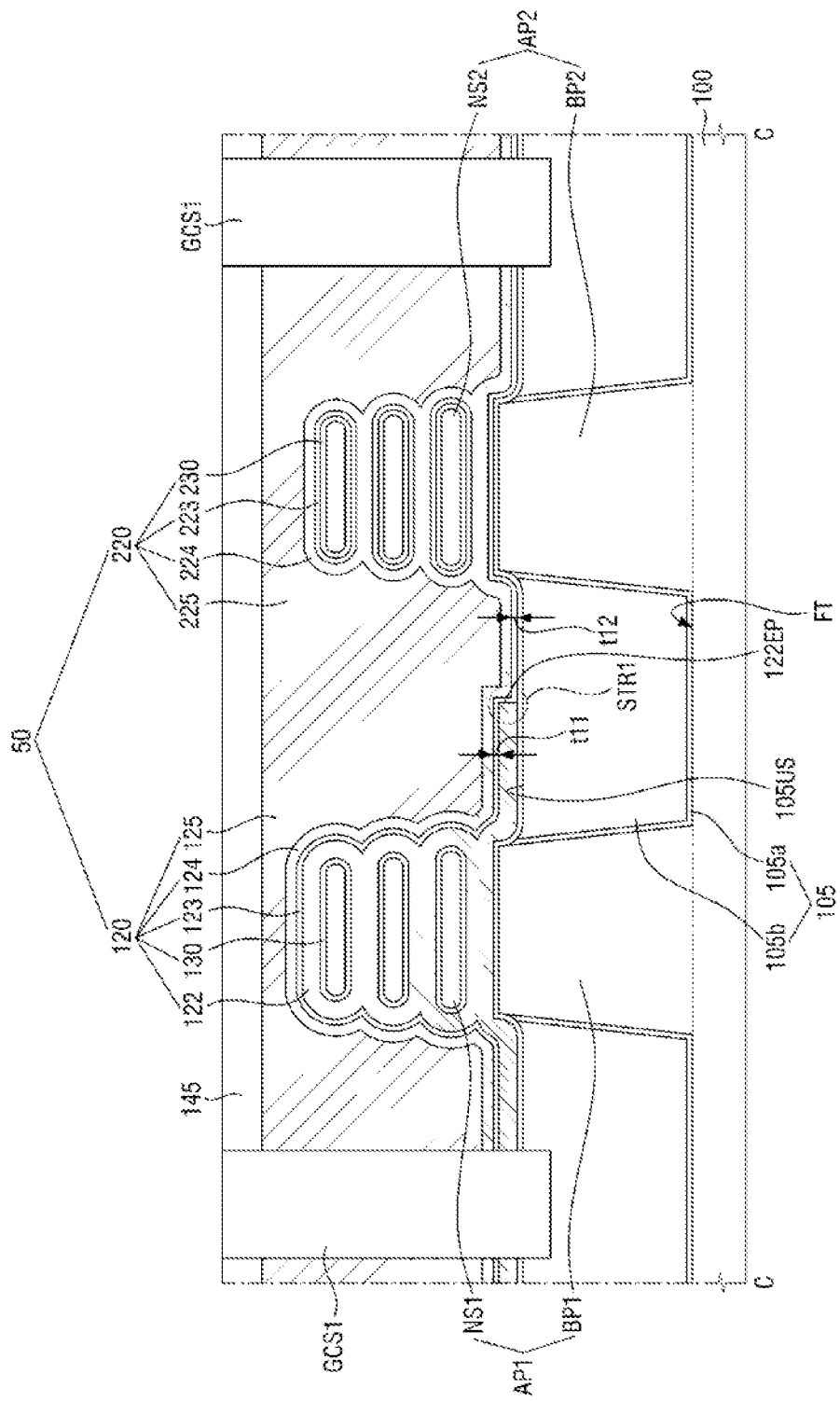

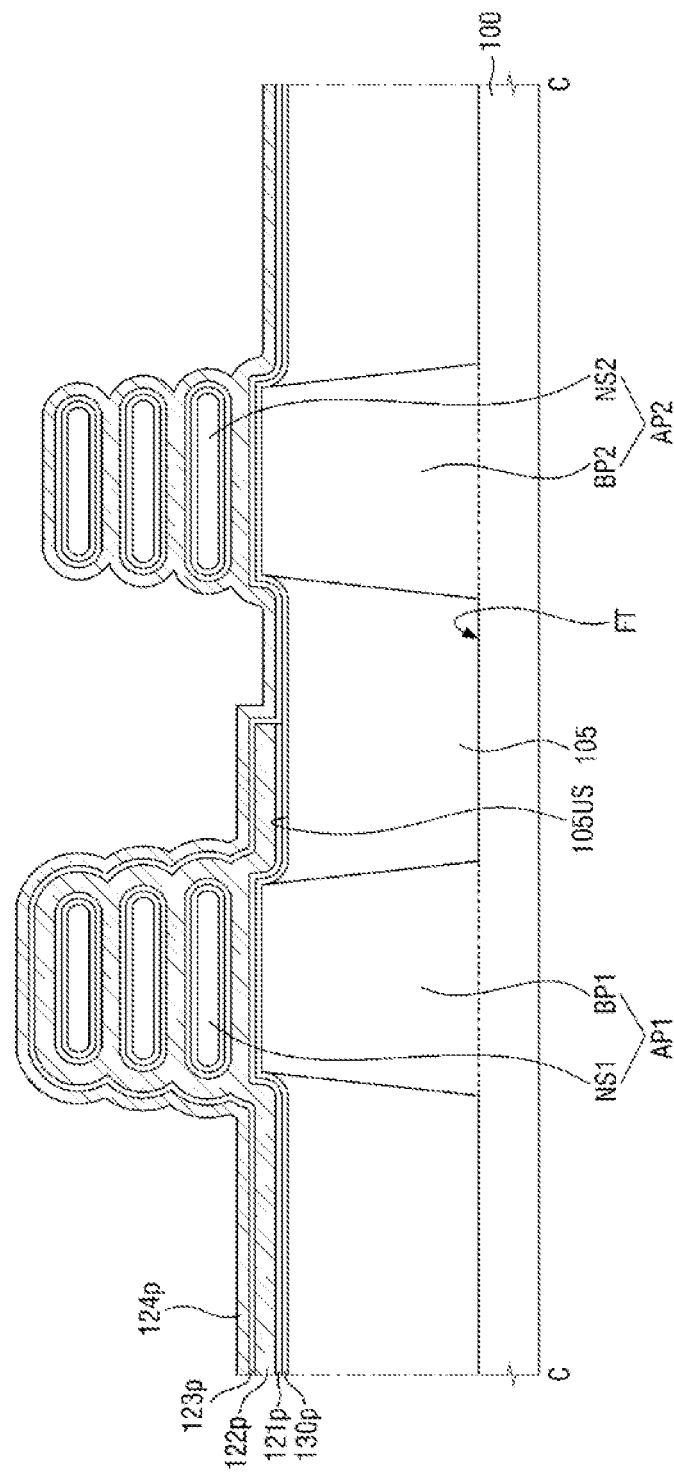

SEMICONDUCTOR DEVICE

CROSS-REFERENCE TO RELATED APPLICATION

This application claims priority under 35 U.S.C. § 119 to Korean Patent Application No. 10-2020-0105130, filed on Aug. 21, 2020, in the Korean Intellectual Property Office, the disclosure of which is incorporated by reference herein in its entirety.

TECHNICAL FIELD

The present disclosure relates to a semiconductor device.

DISCUSSION OF RELATED ART

As a scaling technique for increasing the density of a semiconductor device, a multi-gate transistor has been suggested in which a fin- or nanowire-type multi-channel active pattern (or silicon body) is formed on a substrate and a gate is formed on the surface of the multi-channel active pattern.

Since the multi-gate transistor uses a three-dimensional (3D) channel, scaling can be facilitated. Also, current control capability can be enhanced without increasing the length of the gate of the multi-gate transistor. Also, a short channel effect (SCE), i.e., the phenomenon of the potential of a channel region being affected by a drain voltage, can be effectively suppressed. However, it may be difficult to reduce or modulate threshold voltages of the multi-gate transistors including both a p-type metal-oxide semiconductor (PMOS) and an n-type metal-oxide semiconductor (NMOS), because an appropriate p-type work function film and an appropriate n-type work function film with proper thicknesses are required, while the reduction in thickness of these work function films has reached its limit, and there is a limited space in each of these multi-gate transistors for thick metal film deposition.

SUMMARY

Embodiments of the present disclosure provide a semiconductor device capable of reducing or modulating the threshold voltage of a transistor.

Embodiments of the present disclosure also provide a method of fabricating a semiconductor device capable of reducing or modulating the threshold voltage of a transistor.

According to an embodiment of the present disclosure, there is provided a semiconductor device including, a first active pattern and a second active pattern disposed on a substrate and being adjacent to each other, a field insulating film disposed on the substrate, between the first active pattern and the second active pattern, and being in direct contact with the first active pattern and the second active pattern, a first gate structure intersecting the first active pattern, on the substrate and a second gate structure intersecting the second active pattern, on the substrate, in which the first gate structure includes a first gate insulating film, which is on the first active pattern, a first upper insertion film, which is on the first gate insulating film, and a first upper conductive film, which is on the first upper insertion film and in contact with the first upper insertion film, the second gate structure includes a second gate insulating film, which is on the second active pattern, a second upper insertion film, which is on the second gate insulating film, and a second upper conductive film, which is on the second upper insertion film and in contact with the second upper insertion film, each of the first upper insertion film and the second upper insertion film includes an aluminum nitride film, and each of the first upper conductive film and the second upper conductive film includes aluminum.

According to an embodiment of the present disclosure, there is provided a semiconductor device including, a first active pattern and a second active pattern disposed on a substrate and being adjacent to each other, a field insulating film disposed on the substrate, between the first active pattern and the second active pattern, and being in direct contact with the first active pattern and the second active pattern and a gate structure intersecting the first active pattern and the second active pattern, on the field insulating film, in which the gate structure includes a gate insulating film, which is disposed on the first active pattern and the second active pattern, a lower conductive film, which is disposed on part of the gate insulating film on the first active pattern and defines a stair on a top surface of the field insulating film, an aluminum nitride film, which is disposed on the lower conductive film, across the first active pattern and the second active pattern, and an upper conductive film, which is disposed on the aluminum nitride film, across the first active pattern and the second active pattern, and includes aluminum.

According to an embodiment of the present disclosure, there is provided a semiconductor including, a first active pattern disposed on a substrate, the first active pattern including a first lower pattern and first sheet patterns, which are separated from the first lower pattern, a second active pattern disposed on the substrate, the second active pattern including a second lower pattern, which is adjacent to the first lower pattern, and second sheet patterns, which are separated from the second lower pattern, a field insulating film disposed between, and in direct contact with, the first active pattern and the second active pattern and a gate structure surrounding the first sheet patterns and the second sheet patterns, on the field insulating film, in which the gate structure includes a gate insulating film, which surrounds the first sheet patterns and the second sheet patterns, a lower conductive film, which is on the gate insulating film, an aluminum nitride film, which is on the lower conductive film, and an upper conductive film, which is on the aluminum nitride film, and the lower conductive film surrounds the first sheet patterns, and is not formed along circumferences of the second sheet patterns.

According to an embodiment of the present disclosure, there is provided a semiconductor device including, a first active pattern disposed in a first region of a substrate, a second active pattern disposed in a second region of the substrate, a first gate structure disposed on the first active pattern, and a second gate structure disposed on the second active pattern, in which the first gate structure includes a first gate insulating film, which is on the first active pattern, and a first aluminum nitride film, which is on the first gate insulating film and in contact with the first gate insulating film, the second gate structure includes a second gate insulating film, which is on the second active pattern, and a second aluminum nitride film, which is on the second gate insulating film and in contact with the second gate insulating film and a thickness of the first aluminum nitride film is different from a thickness of the second aluminum nitride film.

According to an embodiment of the present disclosure, there is provided a semiconductor device including, a first active pattern disposed on a substrate, the first active pattern including a first lower pattern and first sheet patterns, which are separated from the first lower pattern, a second active pattern disposed on the substrate, the second active pattern including a second lower pattern, which is adjacent to the first lower pattern, and second sheet patterns, which are separated from the second lower pattern, a field insulating film disposed between, and in direct contact with, the first lower pattern and the second lower pattern, and a gate structure disposed on the field insulating film, the gate structure surrounding the first sheet patterns and the second sheet patterns, in which the gate structure includes a gate insulating film, which surrounds the first sheet patterns and the second sheet patterns, an insertion film, which is in contact with the gate insulating film, a lower conductive film, which is on the insertion film, and an upper conductive film, which is on the lower conductive film, a thickness of the insertion film is greater on the first sheet patterns than on the second sheet patterns, the insertion film includes a titanium aluminum nitride film, and the upper conductive film includes aluminum.

BRIEF DESCRIPTION OF THE DRAWINGS

The above and other aspects and features of the present disclosure will become more apparent by describing in detail embodiments thereof with reference to the accompanying drawings, in which:

FIG. 1 is a layout view of a semiconductor device according to an embodiment of the present disclosure;

FIGS. 4A and 4B are cross-sectional views taken along line C-C of FIG. 1;

FIGS. 22 through 24 are cross-sectional views illustrating a method of fabricating a semiconductor device according to an embodiment of the present disclosure.

Figure 2A:
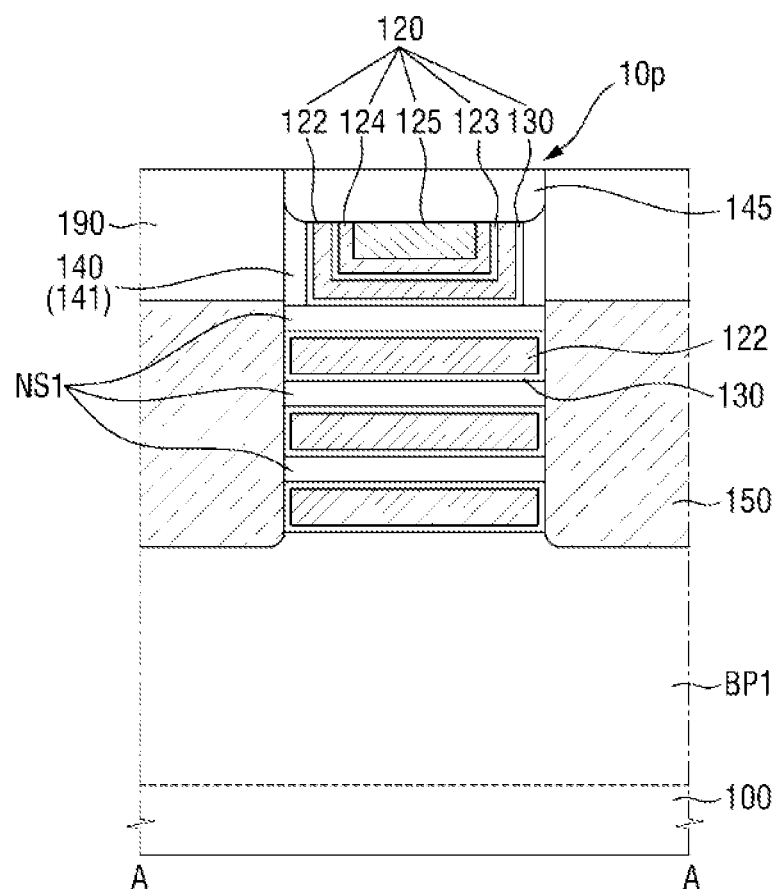
FIGS. 2A and 2B are cross-sectional views taken along line A-A of FIG. 1.

Since the drawings in FIGS. 1-24 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

In the accompanying drawings, a fin field-effect transistor (finFET), which is a fin-type transistor including a fin-type channel region, or a transistor including a nano-wire or a nano-sheet is illustrated as an exemplary semiconductor device according to an embodiment of the present disclosure, but the present disclosure is not limited thereto. For example, the present disclosure may also be applicable to a two-dimensional (2D) material-based field-effect transistor (FET) and a heterostructure thereof.

A semiconductor device according to an embodiment of the present disclosure may include a tunneling FET (TFET) or a three-dimensional (3D) transistor. A semiconductor device according to an embodiment of the present disclosure may include a bipolar junction transistor (BJT) or a laterally-diffused metal-oxide semiconductor (LDMOS) transistor.

Figure 2B:
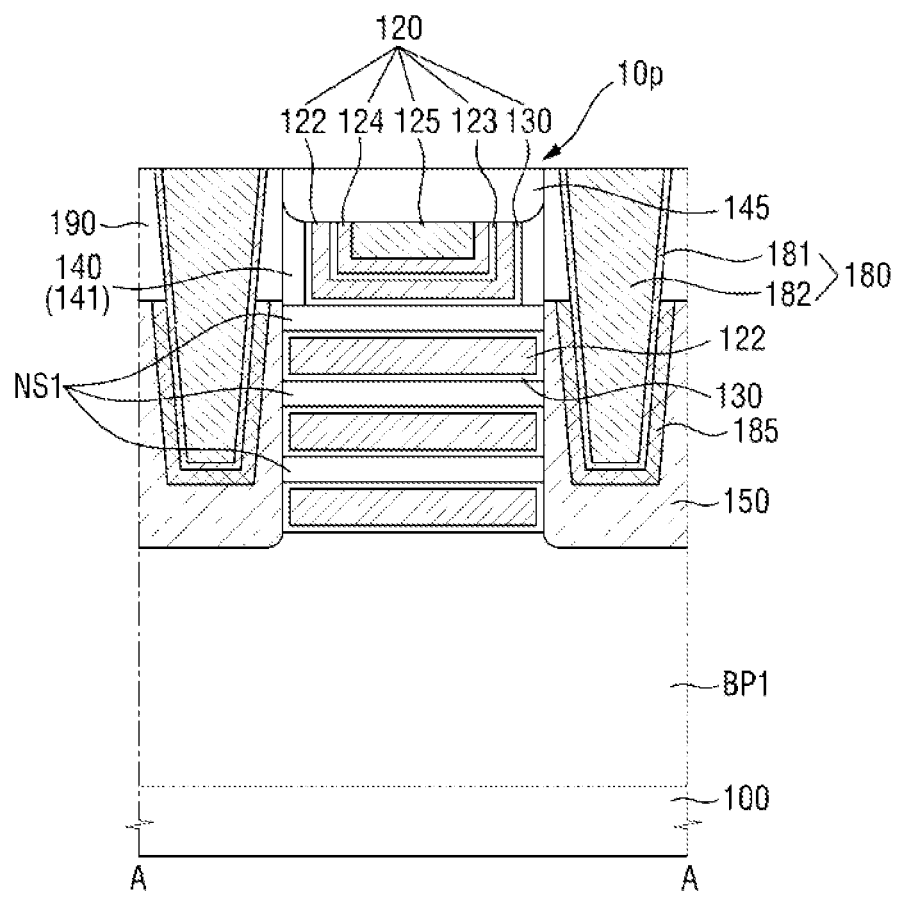
Figure 3A:
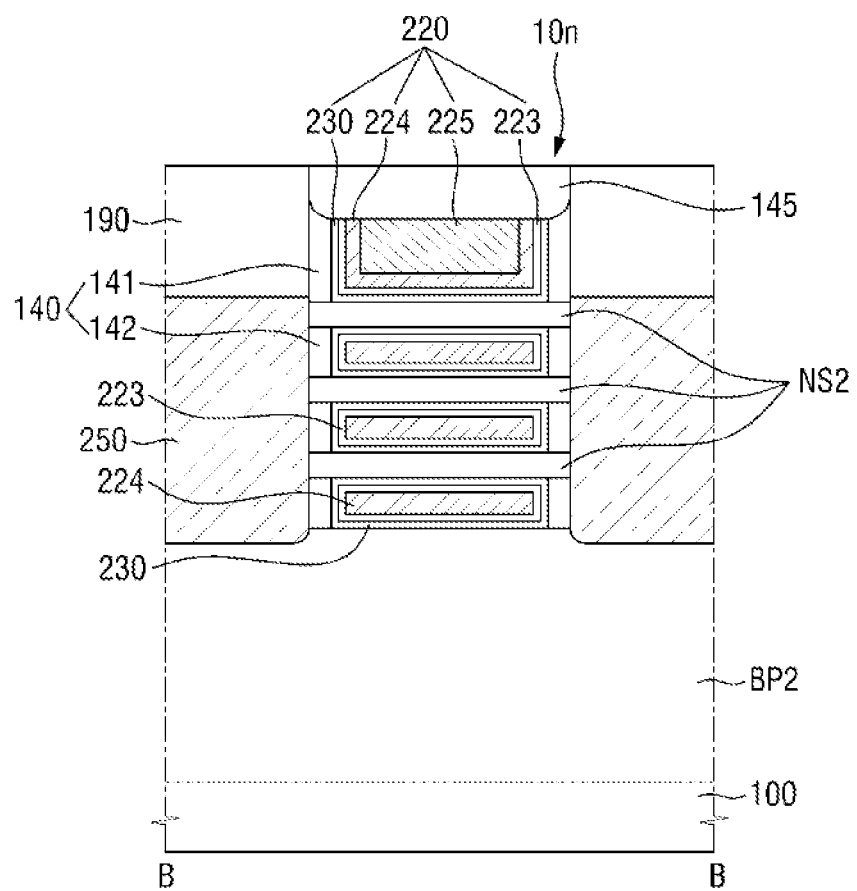
FIGS. 3A and 3B are cross-sectional views taken along line B-B of FIG. 1.
Figure 3B:
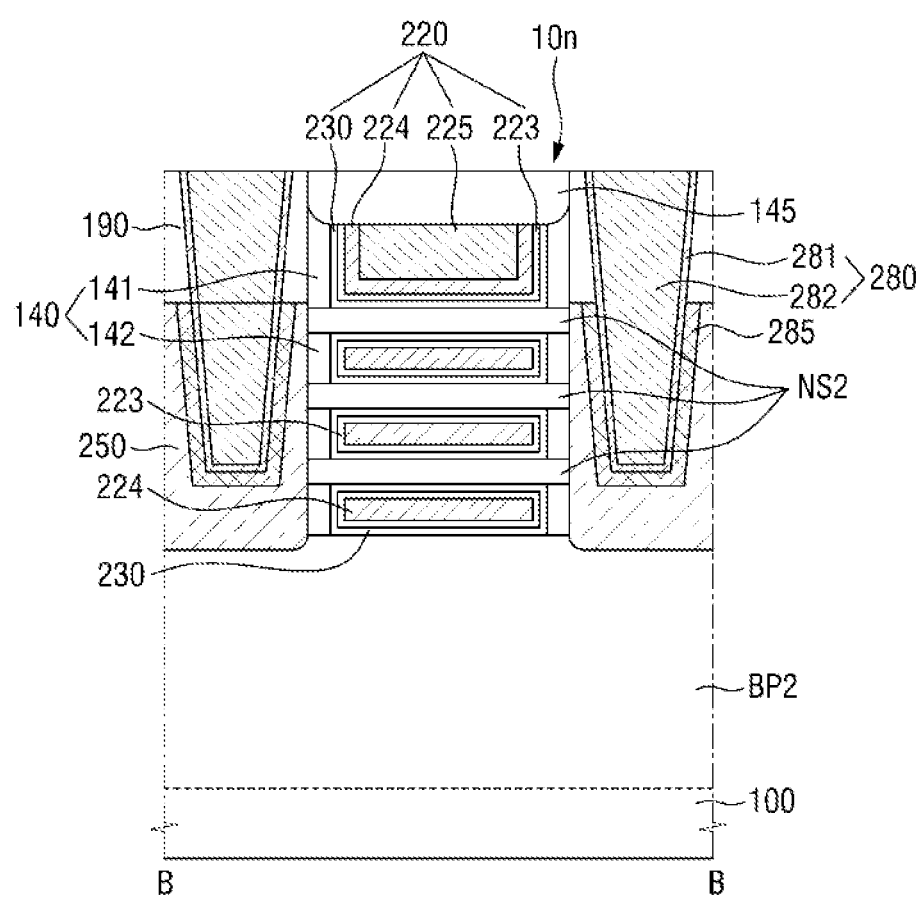
Figure 4A:
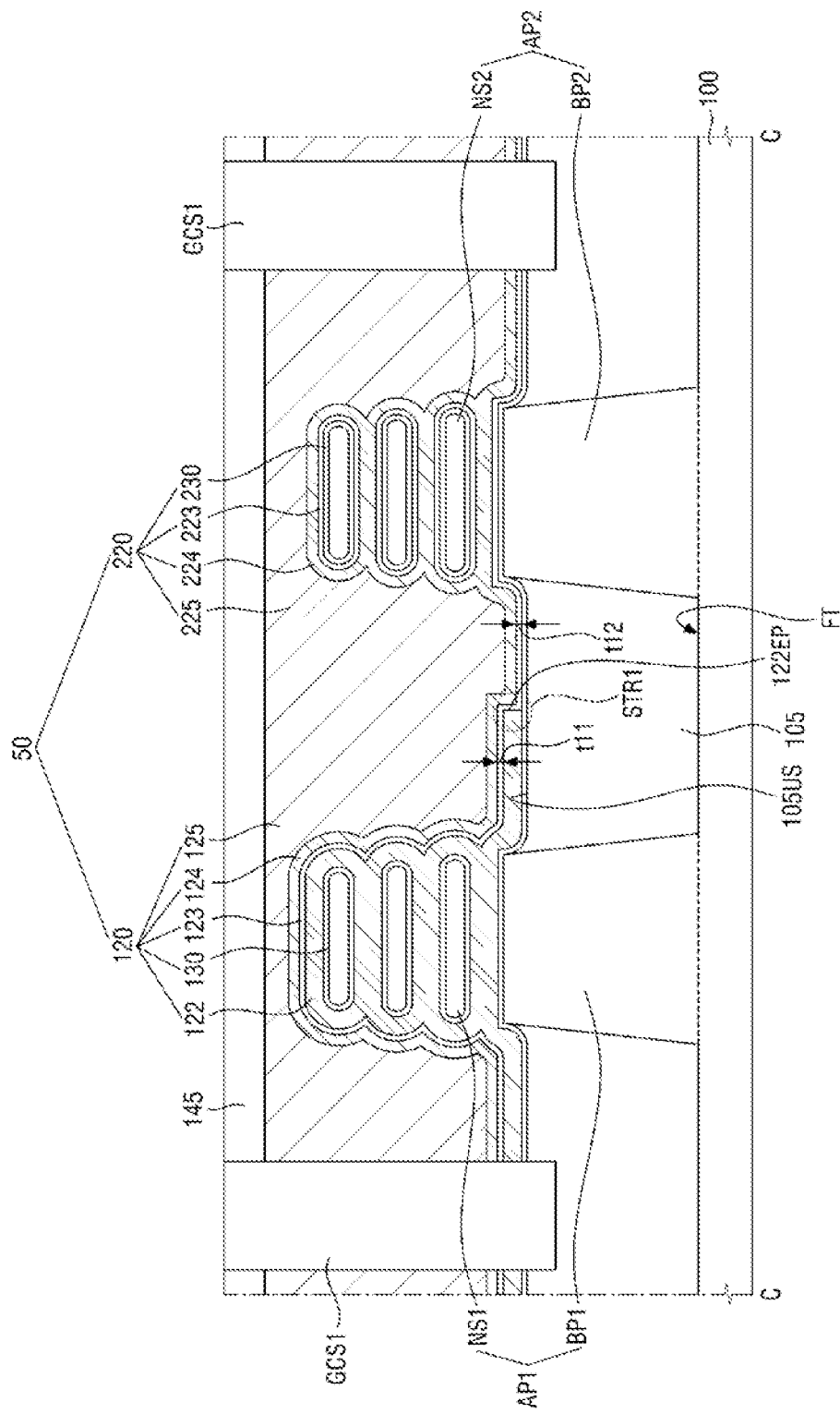

FIG. 1 is a layout view of a semiconductor device according to an embodiment of the present disclosure. FIGS. 2A and 2B are cross-sectional views taken along line A-A of FIG. 1. FIGS. 3A and 3B are cross-sectional views taken along line B-B of FIG. 1. FIGS. 4A and 4B are cross-sectional views taken along line C-C of FIG. 1.

FIG. 2B further illustrates first source/drain contacts 180 in addition to the structure illustrated in FIG. 2A, and FIG. 3B further illustrates second source/drain contacts 280 in addition to the structure illustrated in FIG. 3A.

Referring to FIGS. 1 through 4B, the semiconductor device may include a first active pattern AP1, a second active pattern AP2, a first gate structure 50, and first gate cutting structures GCS1.

A substrate 100 may be a bulk silicon (Si) substrate or a silicon-on-insulator (SOI) substrate. Alternatively, the substrate 100 may be a silicon (Si) substrate or may include another material such as, for example, silicon germanium (SiGe), SiGe-on-insulator (SGOI), indium antimonide (InSb), a lead tellurium (PbTe) compound, indium arsenide (InAs), indium phosphide (InP), gallium arsenide (GaAs), or gallium antimonide (GaSb), but the present disclosure is not limited thereto. In addition, the substrate 100 may include one or more semiconductor layers or structures and may include active or operable portions of semiconductor devices.

The first and second active patterns AP1 and AP2 may be disposed on the substrate 100. The first and second active patterns AP1 and AP2 may extend in a second direction D2, and may be adjacent to each other in a first direction D1. For example, the first and second active patterns AP1 and AP2 may be disposed to be spaced apart from each other in the first direction D1. The first direction D1 may be a direction intersecting the second direction D2.

The first active pattern AP1 may be a region in which a p-type metal-oxide semiconductor (PMOS) is formed, and the second active pattern AP2 may be a region in which an n-type metal-oxide semiconductor (NMOS) is formed. In other words, the first active pattern AP1 may be disposed in a PMOS region, and the second active pattern AP2 may be disposed in an NMOS region. The first active pattern AP1 may include the channel region of the PMOS, and the second active pattern AP2 may include the channel region of the NMOS.

In an embodiment of the present disclosure, the first and second active patterns AP1 and AP2 may be active regions included in a logic region. The first and second active patterns AP1 and AP2 may be active regions included in a single standard cell.

In an embodiment of the present disclosure, the first and second active patterns AP1 and AP2 may be active regions included in a static random-access memory (SRAM) region. The first active pattern AP1 may be a region in which the pull-up transistor of an SRAM is formed, and the second active pattern AP2 may be a region in which the pull-down transistor or the pass transistor of the SRAM is formed. For example, the pull-up transistor including the first active pattern AP1 may be a PMOS transistor, and the pull-down transistor including the second active pattern AP2 may be an NMOS transistor. However, the present disclosure is not limited thereto.

The first active pattern AP1 may include a first lower pattern BP1 and a plurality of first sheet patterns NS1. The second active pattern AP2 may include a second lower pattern BP2 and a plurality of second sheet patterns NS2.

The first and second lower patterns BP1 and BP2 may protrude from the substrate 100, and may extend in the second direction D2. For example, the first and second lower patterns BP1 and BP2 may be formed by partially removing an upper portion of the substrate 100, and thus may be integrally formed with the substrate 100, but the present disclosure is not limited thereto.

The first and second lower patterns BP1 and BP2 may be spaced apart from each other in the first direction D1, and may be separated by a fin trench FT, which extends in the second direction D2.

The first sheet patterns NS1 may be disposed on the first lower pattern BP1, and may be spaced apart from the first lower pattern BP1 in a third direction D3.

The second sheet patterns NS2 may be disposed on the second lower pattern BP2, and may be spaced apart from the second lower pattern BP2 in the third direction D3.

The first sheet patterns NS1 may be sequentially arranged in the third direction D3, and may be spaced apart from one another in the third direction D3. The second sheet patterns NS2 may be sequentially arranged in the third direction D3, and may be spaced apart from one another in the third direction D3. Here, the third direction D3 may be a direction intersecting both the first and second directions D1 and D2. For example, the third direction D3 may be the thickness direction of the substrate 100.

FIGS. 2A and 2B illustrate that three first sheet patterns NS1 are arranged in the third direction D3, but the present disclosure is not limited thereto. For example, the number of first sheet patterns NS1 may be 2 or more than 3. Similarly, FIGS. 3A and 3B illustrate that three second sheet patterns NS2 are arranged in the third direction D3, but the present disclosure is not limited thereto. For example, the number of second sheet patterns NS2 may be 2 or more than 3.

The first and second lower patterns BP1 and BP2 may be formed by etching parts of the substrate 100 or may include epitaxial layers grown from the substrate 100. The first and second lower patterns BP1 and BP2 may include an element semiconductor material such as silicon (Si) or germanium (Ge). Also, the first and second patterns BP1 and BP2 may include a compound semiconductor such as, for example, a group IV-IV compound semiconductor or a group compound semiconductor.

The group IV-IV compound semiconductor may be, for example, a binary or ternary compound containing at least two of carbon (C), silicon (Si), germanium (Ge), and tin (Sn) or a compound obtained by doping the binary or ternary compound with a group IV element. The group IV-IV compound semiconductor may include, for example, silicon germanium (SiGe), silicon carbide (SiC), or silicon germanium carbide (SiGeC), but the present disclosure is not limited thereto.

The group compound semiconductor may be, for example, a binary, ternary, or quaternary compound obtained by combining at least one of aluminum (Al), gallium (Ga), and indium (In), which are group III elements, and one of phosphorus (P), arsenic (As), and antimony (Sb), which are group V elements. The group compound semiconductor may include, for example, gallium phosphide (GaP), gallium arsenide (GaAs), indium arsenide (InAs), indium phosphide (InP), gallium antimonide (GaSb), indium antimonide (InSb), or indium gallium arsenide (InGaAs), but the present disclosure is not limited thereto.

The first sheet patterns NS1 may include an element semiconductor material such as silicon (Si) or germanium (Ge), a group IV-IV compound semiconductor, and/or a group compound semiconductor. The second sheet patterns NS2 may include an element semiconductor material such as silicon (Si) or germanium (Ge), a group IV-IV compound semiconductor, and/or a group compound semiconductor.

In an embodiment of the present disclosure, the first sheet patterns NS1 and the second sheet patterns NS2 may include a material substantially the same as that of the substrate 100 or that of the first and second lower patterns BP1 and BP2.

The width, in the first direction D1, of the first sheet patterns NS1 may increase or decrease in proportion to the width, in the first direction D1, of the first lower pattern BP1. The width, in the first direction D1, of the second sheet patterns NS2 may increase or decrease in proportion to the width, in the first direction D1, of the second lower pattern BP2.

A first field insulating film 105 may be formed on the substrate 100, and may fill at least part of the fin trench FT.

The first field insulating film 105 may be disposed on the substrate 100, between the first and second active patterns AP1 and AP2, and may be in direct contact with the first and second active patterns AP1 and AP2.

The first field insulating film 105 may be in direct contact with the first and second active patterns AP1 and AP2, which means that there exists no other active pattern between the first and second active patterns AP1 and AP2 that can be used as the channel region of a transistor. For example, the first active pattern AP1 may be used as the channel region of the PMOS transistor, and the second active pattern AP2 adjacent to the first active pattern AP1 with the first field insulating film 105 interposed therebetween may be used as the channel region of the NMOS transistor.

The first field insulating film 105 may be disposed between the first and second lower patterns BP1 and BP2, and may be in direct contact with the first and second lower patterns BP1 and BP2.

In an embodiment of the present disclosure, the first field insulating film 105 may cover parts of the sidewalls of the first lower pattern BP1 that define the fin trench FT and/or parts of the sidewalls of the second lower pattern BP2 that define the fin trench FT. For example, part of the first lower pattern BP1 and/or part of the second lower pattern BP2 may protrude beyond a top surface 105US of the first field insulating film 105 in the third direction D3.

In an embodiment of the present disclosure, the first field insulating film 105 may cover the entire sidewalls of the first lower pattern BP1 that define the fin trench FT and the entire sidewalls of the second lower pattern BP2 that define the fin trench FT. For example, the first lower pattern BP1 and the second lower pattern BP2 may not protrude beyond the top surface 105US of the first field insulating film 105 in the third direction D3.

The first sheet patterns NS1 and the second sheet patterns NS2 may be located higher than the top surface 105US of the first field insulating film 105.

The first field insulating film 105 may include, for example, an oxide film, a nitride film, an oxynitride film, or a combination thereof.

Referring to FIG. 4A, the first field insulating film 105 may fill at least part of the fin trench FT. Referring to FIG. 4B, the first field insulating film 105 may include a field liner 105a, which extends along the sidewalls and the bottom surface of the fin trench FT, and a field filling film 105b, which is disposed on the field liner 105a.

The first gate structure 50 may be formed on the substrate 100, and may be disposed on the first field insulating film 105. The first gate structure 50 may extend in the first direction D1, and may intersect the first active pattern AP1, the second active pattern AP2, and the first field insulating film 105.

The first gate structure 50 may intersect the first and second lower patterns BP1 and BP2, and may surround each of the first sheet patterns NS1 and each of the second sheet patterns NS2.

The first gate structure 50 may include a first p-type gate structure 120 and a first n-type gate structure 220. The first p-type gate structure 120 and the first n-type gate structure 220 may be in direct contact with each other.

The first p-type gate structure 120 may be formed on the first active pattern AP1, and may intersect the first active pattern AP1. The first p-type gate structure 120 may include a p-type gate electrode.

The first p-type gate structure 120 may intersect the first lower pattern BP1, and may surround each of the first sheet patterns NS1.

The first n-type gate structure 220 may be formed on the second active pattern AP2, and may intersect the second active pattern AP2. The first n-type gate structure 220 may include an n-type gate electrode.

The first n-type gate structure 220 may intersect the second lower pattern BP2, and may surround each of the second sheet patterns NS2.

The first p-type transistor 10p may be defined in a region where the first p-type gate structure 120 and the first active pattern AP1 intersect each other, and the first n-type transistor 10n may be defined in a region where the first n-type gate structure 220 and the second active pattern AP2 intersect each other. Also, first epitaxial patterns 150 to be described may be included in the source/drain of the first p-type transistor 10p, and second epitaxial patterns 250 to be described may be included in the source/drain of the first n-type transistor 10n.

As the first p-type gate structure 120 extends over the first field insulating film 105, the first p-type gate structure 120 overlaps not only with the first active pattern AP1, but also with part of the first field insulating film 105. As the first n-type gate structure 220 extends over the first field insulating film 105, the first n-type gate structure 220 overlaps not only with the second active pattern AP2, but also with part of the first field insulating film 105. The interface between the first p-type gate structure 120 and the first n-type gate structure 220 may be placed on the top surface 105US of the first field insulating film 105.

The first gate structure 50 may include a first gate insulating film (130 and 230), a first lower conductive film 122, a first upper insertion film (123 and 223), a first upper conductive film (124 and 224), and a first filling conductive film (125 and 225).

The first p-type gate structure 120 may include a (1_1)-th gate insulating film 130, the first lower conductive film 122, a (1_1)-th upper insertion film 123, a (1_1)-th upper conductive film 124, and a (1_1)-th filling conductive film 125. The first n-type gate structure 220 may include a (1_2)-th gate insulating film 230, a (1_2)-th upper insertion film 223, a (1_2)-th upper conductive film 224, and a (1_2)-th filling conductive film 225. For example, the first lower conductive film 122 may be formed on the (1_1)-th gate insulating film 130 in the first p-type gate structure 120, and there is no lower conductive film in the first n-type gate structure 220.

The (1_1)-th gate insulating film 130 may be disposed on the first active pattern AP1, and may extend along the top surface 105US of the first field insulating film 105 and the top surface of the first lower pattern BP1. The (1_1)-th gate insulating film 130 may surround each of the first sheet patterns NS1, and may be disposed along the circumferences of the first sheet patterns NS1.

The (1_2)-th gate insulating film 230 may be disposed on the second active pattern AP2, and may extend along the top surface 105US of the first field insulating film 105 and the top surface of the second lower pattern BP2. The (1_2)-th gate insulating film 230 may surround each of the second sheet patterns NS2, and may be disposed along the circumferences of the second sheet patterns NS2. The (1_1)-th gate insulating film 130 and the (1_2)-th gate insulating film 230 may be in direct contact with the top surface 105US of the first field insulating film 105. The (1_1)-th gate insulating film 130 and the (1_2)-th gate insulating film 230 may be formed on the same level. Here, the expression "forming two elements on the same level" means that the two elements are formed by the same manufacturing process, and may include the same material. The first gate insulating film (130 and 230) may be disposed across the first and second active patterns AP1 and AP2.

The (1_1)-th gate insulating film 130 and the (1_2)-th gate insulating film 230 may include silicon oxide ($SiO_2$), silicon oxynitride (SiON), silicon nitride ($Si_3N_4$), or a high-k material having a dielectric constant greater than that of silicon oxide ($SiO_2$). The high-k material may include at least one of, for example, boron nitride (BN), hafnium oxide ($HfO_2$), hafnium silicon oxide ($HfSiO_4$), hafnium zirconium oxide ($HfZrO_4$), hafnium tantalum oxide ($Hf_2Ta_2O_9$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), lithium oxide ($Li_2O$), aluminum oxide ($Al_2O_3$), lead scandium tantalum oxide ($Pb(Sc,Ta)O_3$), lead zinc niobate [$Pb(Zn_{1/3}Nb_{2/3})O_3$], or combinations thereof.

Figure 19:
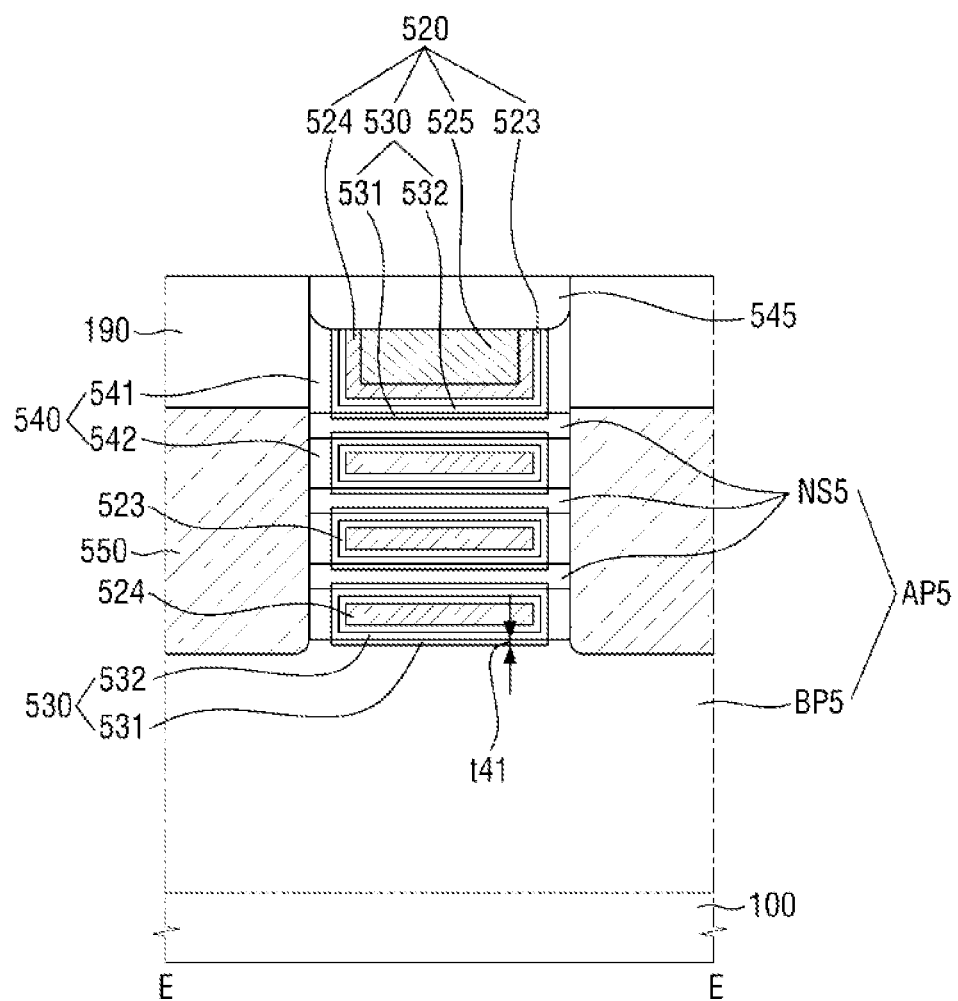
FIG. 19 is a cross-sectional view taken along line E-E of FIG. 18.

FIGS. 2A through 4B illustrate that the (1_1)-th gate insulating film 130 and the (1_2)-th gate insulating film 230 are single-layer films, but the present disclosure is not limited thereto. Alternatively, as illustrated in FIG. 19, each of the (1_1)-th gate insulating film 130 and the (1_2)-th gate insulating film 230 may include an interface film (531 of FIG. 19) and a high-k dielectric film (532 of FIG. 19) on the interface film.

The first lower conductive film 122 may be disposed on the first active pattern AP1. The first lower conductive film 122 may be formed on the (1_1)-th gate insulating film 130, and may be disposed on part of the first gate insulating film (130 and 230) on the first active pattern AP1. The first lower conductive film 122 may surround each of the first sheet patterns NS1, and may be disposed along the circumferences of the first sheet patterns NS1. The (1_1)-th gate insulating film 130 may be interposed between the first lower conductive film 122 and each of the first sheet patterns NS1.

In an embodiment of the present disclosure, the first lower conductive film 122 may generally fill the spaces between the first lower pattern BP1 and the first sheet patterns NS1 and between the first sheet patterns NS1. For example, when there are two adjacent first sheet patterns NS1 in the third direction D3, for example, a (1_1)-th sheet pattern NS1 and a (1_2)-th sheet pattern NS1, the first lower conductive film 122 may generally fill the space from the top surface of the (1_1)-th sheet pattern NS1 to the bottom surface of the (1_2)-th sheet pattern NS1. For example, the first lower conductive film 122 may be in direct contact with the (1_1)-th gate insulating film 130 over the top surface of the (1_1)-th sheet pattern NS1 and in direct contact with the (1_1)-th gate insulating film 130 under the bottom surface of the (1_2)-th sheet pattern NS1.

In an embodiment of the present disclosure, the first lower conductive film 122 may not entirely fill the spaces between the first lower pattern BP1 and the first sheet patterns NS1 and between the first sheet patterns NS1.

The first lower conductive film 122 is not disposed on the second active pattern AP2, and does not extend to the second active pattern AP2. The first lower conductive film 122 is not formed on the (1_2)-th gate insulating film 230, and is not disposed on part of the first gate insulating film (130 and 230) on the second active pattern AP2. The first lower conductive film 122 does not surround each of the second sheet patterns NS2, and is not formed along the circumferences of the second sheet patterns NS2.

The first lower conductive film 122 may include an end portion 122EP, which is disposed on the top surface 105US of the first field insulating film 105, between the first and second active patterns AP1 and AP2. For example, the first lower conductive film 122 may define a first stair STR1 on the top surface 105US of the first field insulating film 105, between the first and second active patterns AP1 and AP2. The first stair STR1 may have a stair shape formed by the end portion 122EP of the first lower conductive film 122. The end portion 122EP of the first lower conductive film 122 may be disposed near the center of the first field insulating film 105 between the first and second active patterns AP1 and AP2 in the first direction D1, but the present disclosure is not limited thereto. For example, the end portion 122EP of the first lower conductive film 122 may be at a location closer to the first lower pattern BP1 than to the second lower pattern BP2 or closer to the second lower pattern BP2 than to the first lower pattern BP1 depending on a circuit design and/or a manufacturing process.

The first p-type gate structure 120 includes the first lower conductive film 122, but the first n-type gate structure 220 may not include the first lower conductive film 122. When the first p-type gate structure 120 and the first n-type gate structure 220 are in direct contact with each other, the first p-type gate structure 120 and the first n-type gate structure 220 may be separated from each other by the first lower conductive film 122. For example, since the first lower conductive film 122 is included in the first p-type gate structure 120 but not included in the first n-type gate structure 220, the end portion 122EP of the first lower conductive film 122 is the end portion of the first p-type gate structure 120. The interface between the first p-type gate structure 120 and the first n-type gate structure 220 may be placed in the end portion 122EP of the first lower conductive film 122. The first stair STR1, which is defined by the first lower conductive film 122, may be located between the first p-type gate structure 120 and the first n-type gate structure 220.

The first lower conductive film 122 may be, for example, a p-type work function film for controlling a work function. The first lower conductive film 122 may include at least one of, for example, titanium nitride (TiN), tantalum carbide (TaC), tantalum nitride (TaN), titanium silicon nitride (TiSiN), tantalum silicon nitride (TaSiN), or tantalum carbonitride (TaCN). For example, the first lower conductive film 122 may include titanium nitride (TiN).

The (1_1)-th upper insertion film 123 may be disposed on the first active pattern AP1, and may be formed on the first lower conductive film 122.

In a case where the first lower conductive film 122 generally fills the spaces between the first lower pattern BP1 and the first sheet patterns NS1 and between the first sheet patterns NS1, the (1_1)-th upper insertion film 123 may extend along the outer profile of the first lower conductive film 122. The (1_1)-th upper insertion film 123 may not be formed in the spaces between the first lower pattern BP1 and the first sheet patterns NS1 and between the first sheet patterns NS1, and may not be formed along the circumferences of the first sheet patterns NS1.

The (1_2)-th upper insertion film 223 may be disposed on the second active pattern AP2, and may be in direct contact with the (1_1)-th upper insertion film 123. The (1_1)-th upper insertion film 123 and the (1_2)-th upper insertion film 223 may be formed on the same level. The (1_2)-th upper insertion film 223 may be formed on the (1_2)-th gate insulating film 230. The (1_2)-th upper insertion film 223 may surround each of the second sheet patterns NS2, and may be disposed along the circumferences of the second sheet patterns NS2. For example, the (1_2)-th gate insulating film 230 may be interposed between the (1_2)-th upper insertion film 223 and each of the second sheet patterns NS2.

The first upper insertion film (123 and 223) may be disposed on the first lower conductive film 122. For example, the first upper insertion film (123 and 223) may be in direct contact with the first lower conductive film 122. The first upper insertion film (123 and 223) may be disposed across the first and second active patterns AP1 and AP2.

As the first lower conductive film 122 is disposed between the (1_1)-th upper insertion film 123 and the (1_1)-th gate insulating film 130, the (1_1)-th upper insertion film 123 may not be in contact with the (1_1)-th gate insulating film 130.

The (1_2)-th upper insertion film 223 may be in direct contact with the (1_2)-th gate insulating film 230 on the second active pattern AP2, and may be in direct contact with the (1_2)-th gate insulating film 230 surrounding the second sheet patterns NS2.

The (1_2)-th upper insertion film 223 may control dipoles in the insulator in the (1_2)-th gate insulating film 230 and may thereby control a work function. For example, the (1_2)-th upper insertion film 223 may be an n-type dipole layer to control the work function and thus to modulate the threshold voltage of the NMOS transistor. The (1_1)-th upper insertion film 123 may prevent the diffusion of the (1_1)-th upper conductive film 124 that will be described later into the first lower conductive film 122, and may thereby prevent any variation in the work function that may be caused by the (1_1)-th upper conductive film 124. For example, the (1_1)-th upper conductive film 124 may have a type of work function different from that of the first lower conductive film 122. Thus, the diffusion of the (1_1)-th upper conductive film 124 into the first lower conductive film 122 may reduce the work function of the first lower conductive film 122, however, it may be prevented by the (1_1)-th upper insertion film 123 interposed therebetween.

The first upper insertion film (123 and 223) may include, for example, an aluminum (Al)-based nitride. For example, the first upper insertion film (123 and 223) may include aluminum nitride (AlN). That is, the (1_1)-th upper insertion film 123 and the (1_2)-th upper insertion film 223 may include aluminum nitride (AlN) films.

In an embodiment of the present disclosure, a thickness t11 of the (1_1)-th upper insertion film 123 may be the same as a thickness t12 of the (1_2)-th upper insertion film 223. In an embodiment of the present disclosure, the thickness t11 of the (1_1)-th upper insertion film 123 may be different from the thickness t12 of the (1_2)-th upper insertion film 223. The amount by which the work function is to be controlled may vary depending on the thickness t11 of the (1_1)-th upper insertion film 123 and the thickness t12 of the (1_2)-th upper insertion film 223.

The (1_1)-th upper conductive film 124 may be disposed on the first active pattern AP1. The (1_1)-th upper conductive film 124 may be formed on the (1_1)-th upper insertion film 123, and may be formed along the profile of the (1_1)-th upper insertion film 123.

The (1_1)-th upper conductive film 124 may not be formed in the spaces between the first lower pattern BP1 and the first sheet patterns NS1 and between the first sheet patterns NS1. The (1_1)-th upper conductive film 124 may not be formed along the circumferences of the first sheet patterns NS1.

The (1_2)-th upper conductive film 224 may be disposed on the second active pattern AP2, and may be in direct contact with the (1_1)-th upper conductive film 124. The (1_2)-th upper conductive film 224 may be formed on the (1_2)-th upper insertion film 223. The (1_2)-th upper conductive film 224 may surround each of the second sheet patterns NS2, and may be disposed along the circumferences of the second sheet patterns NS2.

In an embodiment of the present disclosure, the (1_2)-th upper conductive film 224 may generally fill the spaces between the second lower pattern BP2 and the second sheet patterns NS2 and between the second sheet patterns NS2. For example, when there are two adjacent second sheet patterns NS2 in the third direction D3, for example, a (2_1)-th sheet pattern NS2 and a (2_2)-th sheet pattern NS2, the (1_2)-th upper conductive film 224 may generally fill the space from the top surface of the (2_1)-th sheet pattern NS2 to the bottom surface of the (2_2)-th sheet pattern NS2. For example, the (1_2)-th upper conductive film 224 may be in direct contact with the (1_2)-th upper insertion film 223 over the top surface of the (2_1)-th sheet pattern NS2 and in direct contact with the (1_2)-th upper insertion film 223 under the bottom surface of the (2_2)-th sheet pattern NS2.

In an embodiment of the present disclosure, the (1_2)-th upper conductive film 224 may not entirely fill the spaces between the second lower pattern BP2 and the second sheet patterns NS2 and between the second sheet patterns NS2.

The first upper conductive film (124 and 224) may be disposed on the first upper insertion film (123 and 223), and may be disposed across the first and second active patterns AP1 and AP2. For example, the (1_1)-th upper conductive film 124 may be in direct contact with the (1_1)-th upper insertion film 123, and the (1_2)-th upper conductive film 224 may be in direct contact with the (1_2)-th upper insertion film 223.

The first upper conductive film (124 and 224) may be, for example, an n-type work function film for controlling a work function. For example, the (1_2)-th upper insertion film 223, which may be an n-type dipole layer, together with the (1_2)-th upper conductive film 224, which may be a n-type work function film, may control a work function and thus may modulate the threshold voltage of the NMOS transistor. The first upper conductive film (124 and 224) may include, for example, aluminum (Al). The first upper conductive film (124 and 224) may include at least one of, for example, titanium aluminum (TiAl), titanium aluminum nitride (TiAlN), titanium aluminum carbide (TiAlC), titanium aluminum carbonitride (TiAlCN), tantalum aluminum (TaAl), tantalum aluminum carbide (TaAlC), tantalum aluminum nitride (TaAlN), or tantalum aluminum carbonitride (TaAlCN). The (1_1)-th upper conductive film 124 and the (1_2)-th upper conductive film 224 may be formed on the same level.

The first filling conductive film (125 and 225) may be disposed on the first upper conductive film (124 and 224), and may be disposed across the first and second active patterns AP1 and AP2. For example, the (1_1)-th filling conductive film 125 and the (1_2)-th filling conductive film 225 may be disposed on the (1_1)-th upper conductive film 124 and the (1_2)-th upper conductive film 224, respectively. For example, the first filling conductive film (125 and 225) may fill a space surrounded by the first upper conductive film (124 and 224). The (1_1)-th filling conductive film 125 may be disposed on the first active pattern AP1. The (1_2)-th filling conductive film 225 may be disposed on the second active pattern AP2.

The first filling conductive film (125 and 225) may include at least one of, for example, tungsten (W), aluminum (Al), cobalt (Co), copper (Cu), ruthenium (Ru), nickel (Ni), platinum (Pt), nickel-platinum (Ni—Pt), titanium (Ti), or titanium nitride (TiN). The (1_1)-th filling conductive film 125 and the (1_2)-th filling conductive film 225 may be formed on the same level.

In an embodiment of the present disclosure, in a case where the first upper conductive film (124 and 224) is formed to be relatively thick, the (1_1)-th filling conductive film 125 may not be disposed in an area that overlaps with the first active pattern AP1 in the third direction D3. The (1_1)-th filling conductive film 125 may be deposited in an area overlaps the first field insulating film 105 in the third direction D3.

First epitaxial patterns 150 may be disposed on the first lower pattern BP1. The first epitaxial patterns 150 may be disposed on at least one side of the first p-type gate structure 120, and may be connected to the first sheet patterns NS1.

Second epitaxial patterns 250 may be disposed on the second lower pattern BP2. The second epitaxial patterns 250 may be disposed on at least one side of the first n-type gate structure 220, and may be connected to the second sheet patterns NS2.

The first epitaxial patterns 150 may be included in the source/drain of the first p-type transistor 10*p*, which uses the first sheet pattern NS1 as a channel region. The second epitaxial patterns 250 may be included in the source/drain of the first n-type transistor 10*n*, which uses the second sheet pattern NS2 as a channel region. The first epitaxial patterns 150 may be electrically connected to the first sheet patterns NS1 and the first lower pattern BP1, and may be electrically insulated from the first p-type gate structure 120 by the (1_1)-th gate insulating film 130 and first gate spacers 140 to be described. The second epitaxial patterns 250 may be electrically connected to the second sheet patterns NS2 and the second lower pattern BP2, and may be electrically insulated from the first n-type gate structure 220 by the a (1_2)-th gate insulating film 230 and the first gate spacers 140 to be described.

Referring to FIG. 2B, the first source/drain contacts 180 may be disposed on the first epitaxial patterns 150, and may include first contact barrier films 181 and first contact filling films 182. First metal silicide films 185 may be further disposed between the first source/drain contacts 180 and the first epitaxial patterns 150 to reduce contact resistance.

Referring to FIG. 3B, the second source/drain contacts 280 may be disposed on the second epitaxial patterns 250, and may include second contact barrier films 281 and second contact filling films 282. Second metal silicide films 285 may be further disposed between the second source/drain contacts 280 and the second epitaxial patterns 250 to reduce contact resistance.

Parts of the first source/drain contacts 180 may be inserted in the first epitaxial patterns 150. Parts of the second source/drain contacts 280 may be inserted in the second epitaxial patterns 250. The bottom surfaces of the first source/drain contacts 180 may be located between the top surface of the lowermost first sheet pattern NS1 and the bottom surface of the uppermost first sheet pattern NS1. The bottom surfaces of the second source/drain contacts 280 may be located between the top surface of the lowermost second sheet pattern NS2 and the bottom surface of the uppermost second sheet pattern NS2. However, the present disclosure is not limited thereto.

The first contact barrier films 181 and the second contact barrier films 281 may include at least one of, for example, tantalum (Ta), tantalum nitride (TaN), titanium (Ti), titanium nitride (TiN), ruthenium (Ru), cobalt (Co), nickel (Ni), nickel boride (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material. The 2D material may be a metallic material and/or a semiconductor material, and may include a 2D allotrope or a 2D compound. For example, the 2D material may include at least one of, for example, graphene, molybdenum disulfide ($MoS_2$), molybdenum diselenide ($MoSe_2$), tungsten diselenide ($WSe_2$), or tungsten disulfide ($WS_2$), but the present disclosure is not limited thereto. That is, the type of the 2D material is not particularly limited. The first contact filling films 182 and the second contact filling films 282 may include at least one of, for example, aluminum (Al), tungsten (W), cobalt (Co), ruthenium (Ru), silver (Ag), gold (Au), manganese (Mn), or molybdenum (Mo).

The first metal silicide films 185 and the second metal silicide films 285 may include metal silicide.

In an embodiment of the present disclosure, unlike what is illustrated in FIGS. 2B and 3B, the first source/drain contacts 180 and the second source/drain contacts 280 may not include the first contact barrier films 181 and the second contact barrier films 281, respectively.

In an embodiment of the present disclosure, unlike what is illustrated in FIGS. 2B and 3B, the first source/drain contacts 180 and the second source/drain contacts 280 may not be inserted in the first epitaxial patterns 150 and the second epitaxial patterns 250, respectively. For example, the first source/drain contacts 180 and the second source/drain contacts 280 may be deposited on the top surfaces without insertion into the first epitaxial patterns 150 and the second epitaxial patterns 250, respectively, and the first metal silicide films 185 and the second metal silicide films 285 may be disposed at the interfaces thereof, respectively.

First gate spacers 140 may be disposed on sidewalls of the first gate structure 50. For example, the first gate spacers 140 may be disposed on the sidewalls of the first p-type gate structure 120 and the sidewalls of the first n-type gate structure 220.

Referring to FIGS. 3A and 3B, the first gate spacers 140 disposed on the second lower pattern BP2 may include first outer spacers 141 and first inner spacers 142. The first inner spacers 142 may be disposed between the second sheet patterns NS2, which are adjacent to one another in the third direction D3. Referring to FIGS. 2A and 2B, the first gate spacers 140 disposed on the first lower patter BP1 may include first outer spacers 141, but may not include first inner spacers 142.

In an embodiment of the present disclosure, the first gate spacers 140 disposed on the first lower pattern BP1 and the first gate spacers 140 disposed on the second lower pattern BP2 may both include first outer spacers 141 and first inner spacers 142. In an embodiment of the present disclosure, the first gate spacers 140 disposed on the first lower pattern BP1 and the first gate spacers 140 disposed on the second lower pattern BP2 may both include only first outer spacers 141, but may not include first inner spacers 142.

The first outer spacers 141 and the first inner spacers 142 may each include at least one of, for example, silicon nitride ($Si_3N_4$), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), or a combination thereof. In an embodiment of the present disclosure, the first outer spacers 141 and the first inner spacers 142 may include the same material. Alternatively, the first outer spacers 141 and the first inner spacers 142 may include different materials.

A first gate capping pattern 145 may be disposed on the first gate structure 50 and on the first gate spacers 140. The top surface of the first gate capping pattern 145 may be placed on the same plane as the top surface of an interlayer insulating film 190.

In an embodiment of the present disclosure, the first gate capping pattern 145 may be disposed on the first gate structure 50 and between the first gate spacers 140.

The first gate capping pattern 145 may include at least one of, for example, silicon nitride ($Si_3N_4$), silicon oxynitride (SiON), silicon oxide ($SiO_2$), silicon carbonitride (SiCN), silicon oxycarbonitride (SiOCN), or a combination thereof.

A pair of first gate cutting structures GCS1 may be disposed on the substrate 100, and may be disposed on the first field insulating film 105.

The first gate cutting structures GCS1 may be disposed to be spaced apart from each other in the first direction D1, and may extend in the second direction D2. The first and second active patterns AP1 and AP2 may be disposed between a pair of adjacent first gate cutting structures GCS1 in the first direction D1. For example, the first and second lower patterns BP1 and BP2 may be disposed between the pair of adjacent first gate cutting structures GCS1 in the first direction D1. The pair of adjacent first gate cutting structures GCS1 may extend in parallel with the first and second lower patterns BP1 and BP2 in the second direction D2.

The first gate structure 50 may be disposed between the pair of adjacent first gate cutting structures GCS1 in the first direction D1. The first gate cutting structures GCS1 may separate a pair of adjacent gate structures in the first direction D1. The short sidewalls of the first gate structure 50 may face corresponding sidewalls of the first gate cutting structures GCS1 (see FIG. 1).

The first gate insulating film (130 and 230) does not extend along the sidewalls of each of the first gate cutting structures GCS1.

In an embodiment of the present disclosure, the first gate cutting structures GCS1 may be disposed along the boundaries of a standard cell. For example, the first gate cutting structures GCS1 may be standard cell separating structures. In an embodiment of the present disclosure, the first gate cutting structures GCS1 may be disposed in an SRAM region and may be gate separating structures.

The first gate cutting structures GCS1 may include at least one of, for example, silicon nitride ($Si_3N_4$), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), aluminum oxide ($Al_2O_3$) or a combination thereof. The first gate cutting structures GCS1 are illustrated as being single-layer films, but the present disclosure is not limited thereto.

The top surfaces of the first gate cutting structures GCS1 may be placed on a plane the same as that of the top surface of the first gate capping pattern 145, but the present disclosure is not limited thereto.

The bottom surfaces of the first gate cutting structures GCS1 are illustrated as being closer than the boundary between the first gate insulating film (130 and 230) and the first field insulating film 105 to the substrate 100, but the present disclosure is not limited thereto. For example, the first gate cutting structures GCS1 may extend in the third direction D3, such that the bottom surfaces of the first gate cutting structures GCS1 may each at least reach the top surface of the first gate insulating film (130 and 230) over the first field insulating film 105 to separate a pair of adjacent gate structures in the first direction D1.

The interlayer insulating film 190 may be disposed on the first and second epitaxial patterns 150 and 250. The interlayer insulating film 190 may include, for example, silicon oxide ($SiO_2$), silicon nitride ($Si_3N_4$), silicon oxynitride (SiON), flowable oxide (FOX), tonen silazene (TOSZ), undoped silicate glass (USG), borosilicate glass (BSG), phosphosilicate glass (PSG), borophosphosilicate glass (BPSG), plasma-enhanced tetra ethyl ortho silicate (PETEOS), fluoride silicate glass (FSG), carbon-doped silicon oxide (CDO), xerogel, aerogel, amorphous fluorinated carbon, organo silicate glass (OSG), parylene, bis-benzocyclobutene (BCB), SiLK, polyimide, a porous polymeric material, or a combination thereof, but the present disclosure is not limited thereto.

A wire that extends in the second direction D2 along the first gate cutting structure GCS1 may be disposed on the first gate cutting structure GCS1.

Figure 5:
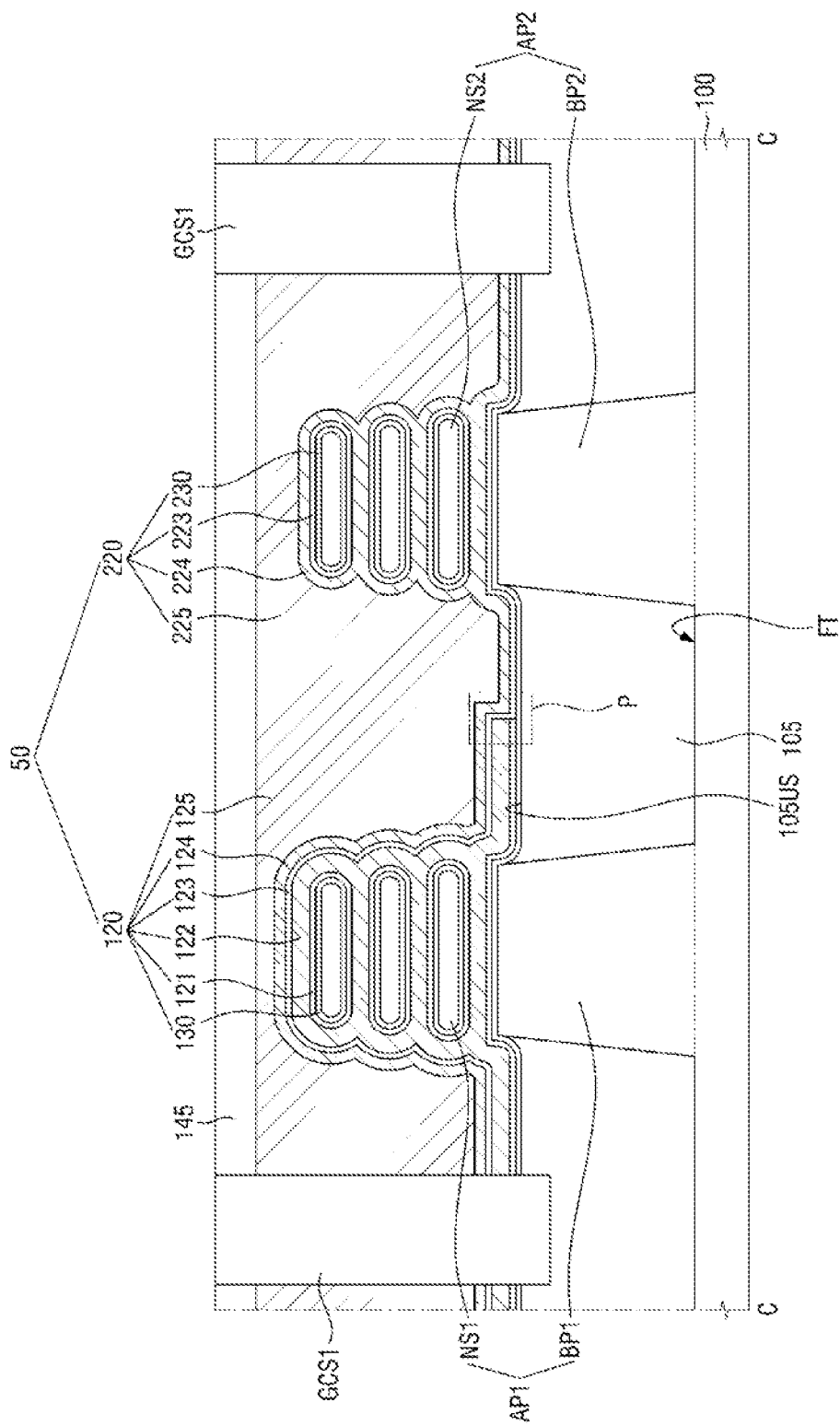
FIG. 5 is a cross-sectional view of a semiconductor device according to an embodiment of the present disclosure.
Figure 6:
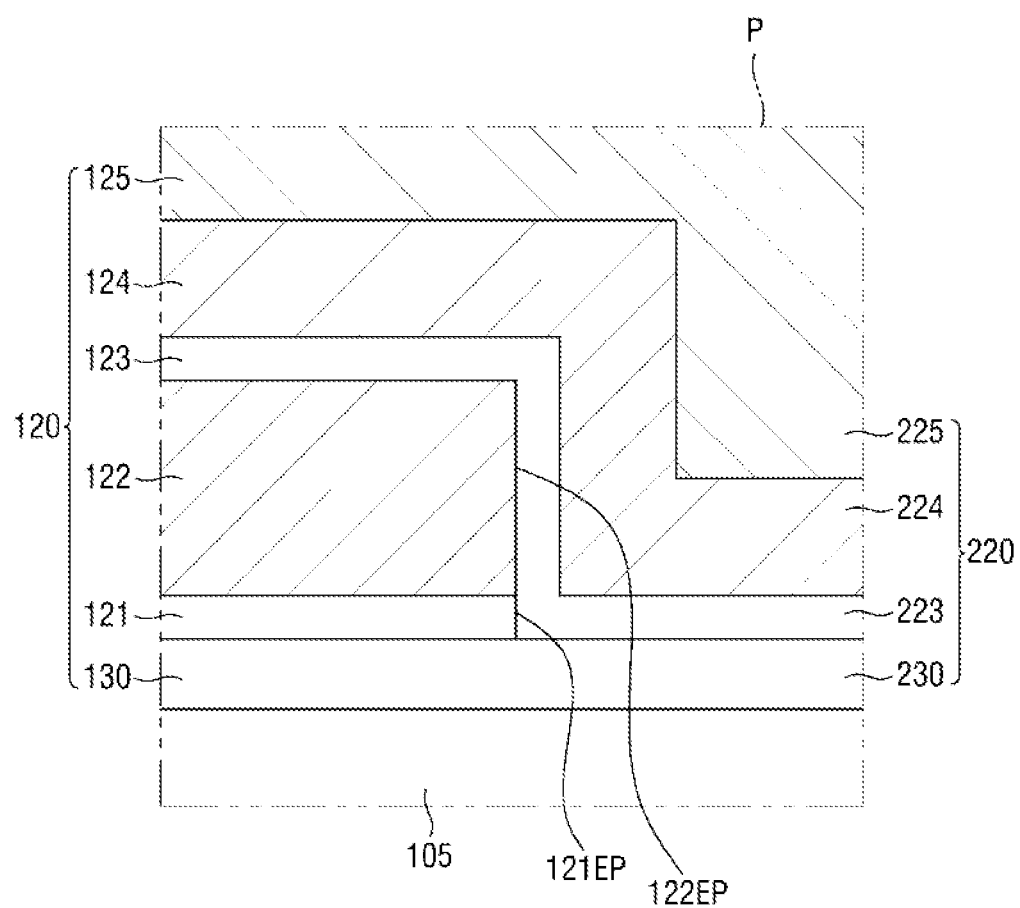
FIGS. 6 through 8 are enlarged cross-sectional views of part P of FIG. 5.
Figure 7:
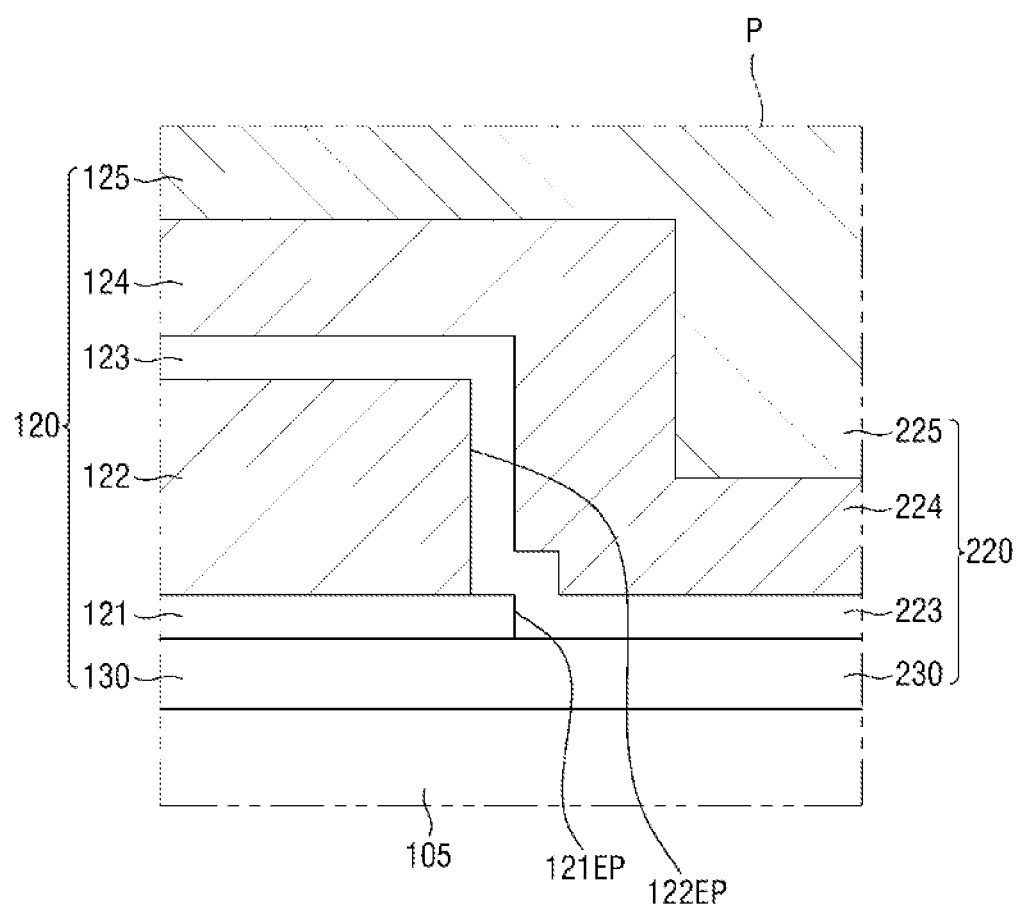
Figure 8:
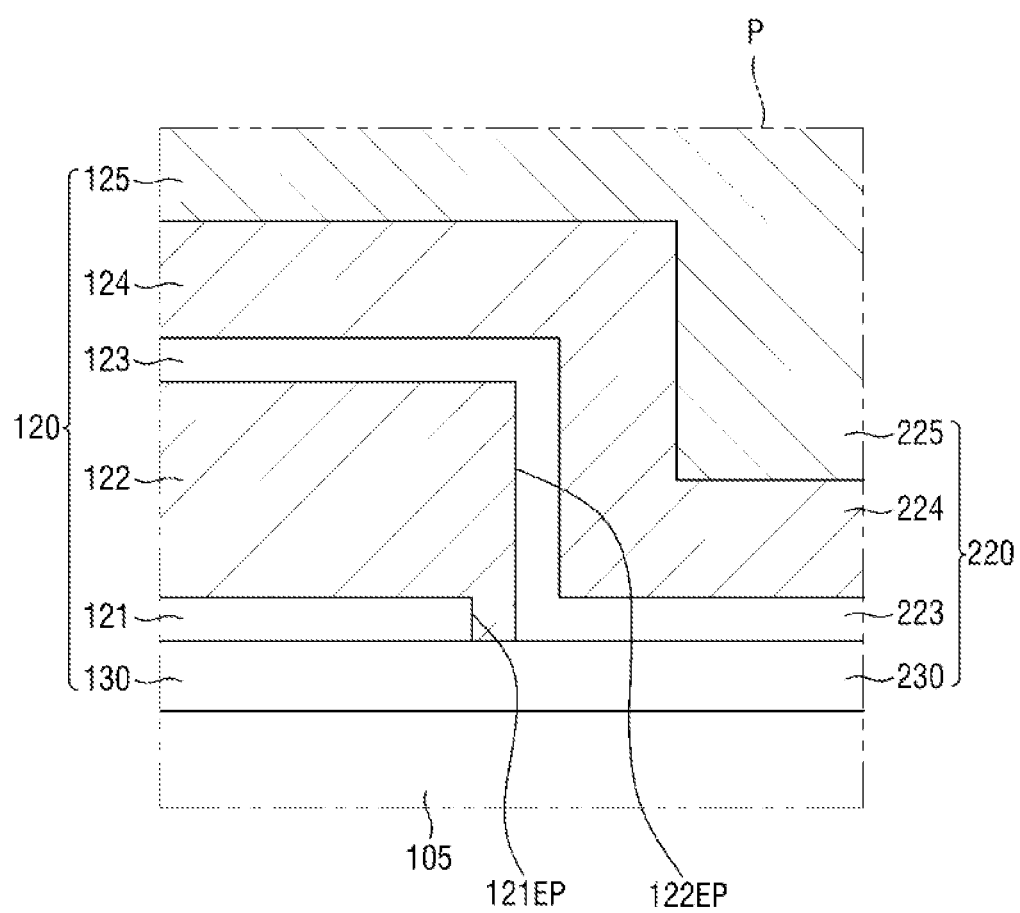

FIG. 5 is a cross-sectional view of a semiconductor device according to an embodiment of the present disclosure. FIGS. 6 through 8 are enlarged cross-sectional views of part P of FIG. 5. For the convenience of explanation, the semiconductor device of FIGS. 5 through 8 will hereinafter be described, focusing mainly on the differences with the semiconductor device of FIGS. 1 through 4B.

Referring to FIGS. 5 through 8, a first gate structure 50 may further include a first lower insertion film 121, which is disposed between a first gate insulating film (130 and 230) and a first lower conductive film 122.

The first lower insertion film 121 may be disposed on a first active pattern AP1. The first lower insertion film 121 may be formed on a (1_1)-th gate insulating film 130, and may be disposed on part of the first gate insulating film (130 and 230) on the first active pattern AP1. For example, the first lower insertion film 121 may be in direct contact with the (1_1)-th gate insulating film 130. A first p-type gate structure 120 may include the (1_1)-th gate insulating film 130, the first lower insertion film 121, the first lower conductive film 122, a (1_1)-th upper insertion film 123, a (1_1)-th upper conductive film 124, and a (1_1)-th filling conductive film 125.

The first lower insertion film 121 may surround each of first sheet patterns NS1, and may be disposed along the circumferences of the first sheet patterns NS1. For example, the first lower insertion film 121 may be interposed between the (1_1)-th gate insulating film 130 and the first lower conductive film 122.

The first lower insertion film 121 is not formed on a second active pattern AP2, and does not extend to the second active pattern AP2. The first lower insertion film 121 is not disposed on part of the first gate insulating film (130 and 230) on the second active pattern AP2. The first lower insertion film 121 does not surround each of second sheet patterns NS2, and is not formed along the circumferences of the second sheet patterns NS2.

The first lower insertion film 121 may include an end portion 121EP, which is disposed on a top surface 105US of the first field insulating film 105, between the first and second active patterns AP1 and AP2.

Referring to FIG. 6, the end portion 121EP of the first lower insertion film 121 and an end portion 122EP of the first lower conductive film 122 are aligned in the third direction D3 on the top surface 105US of the first field insulating film 105. In other words, the first lower conductive film 122 does not cover the end portion 121EP of the first lower insertion film 121.

In an embodiment of the present disclosure, referring to FIG. 7, the end portion 121EP of the first lower insertion film 121 may be closer than the end portion 122EP of the first lower conductive film 122 to the second active pattern AP2. In other words, the end portion 121EP of the first lower insertion film 121 and the end portion 122EP of the first lower conductive film 122 are not aligned on the top surface 105US of the first field insulating film 105. The first lower conductive film 122 does not cover the end portion 121EP of the first lower insertion film 121.

In an embodiment of the present disclosure, referring to FIG. 8, the end portion 122EP of the first lower conductive film 122 may be closer than the end portion 121EP of the first lower insertion film 121 to the second active pattern AP2. In other words, the end portion 121EP of the first lower insertion film 121 and the end portion 122EP of the first lower conductive film 122 are not aligned on the top surface 105US of the first field insulating film 105. The first lower conductive film 122 covers the end portion 121EP of the first lower insertion film 121. Each of the end portion 121EP of the first lower insertion film 121 and the end portion 122EP of the first lower conductive film 122 may be disposed near the center of the first field insulating film 105 in the first direction D1, but the present disclosure is not limited thereto. For example, each of the end portion 121EP of the first lower insertion film 121 and the end portion 122EP of the first lower conductive film 122 may individually be at a location closer to the first lower pattern BP1 than to the second lower pattern BP2 or closer to the second lower pattern BP2 than to the first lower pattern BP1 depending on a circuit design and/or a manufacturing process.

The first lower insertion film 121 may control dipoles in the insulator in the (1_1)-th gate insulating film 130 and may thereby control a work function. For example, the first lower insertion film 121 may be a p-type dipole layer to control the work function and thus to modulate the threshold voltage of the PMOS transistor. For example, the first lower insertion film 121 may be interposed between the (1_1)-th gate insulating film 130 and the first lower conductive film 122, and together with the first lower conductive film 122, which may be a p-type work function film, may control a work function and thus may modulate the threshold voltage of the PMOS transistor.

The first lower insertion film 121 may include, for example, a nitride or an oxide of a metal having an electronegativity of about 1.5 or higher. The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. For example, the first lower insertion film 121 may include at least one of molybdenum oxide (MoO), molybdenum nitride (MoN), niobium oxide (NbO), niobium nitride (NbN), nickel oxide (NiO), tin oxide ($SnO_2$), or titanium oxide ($TiO_2$).

Figure 9:
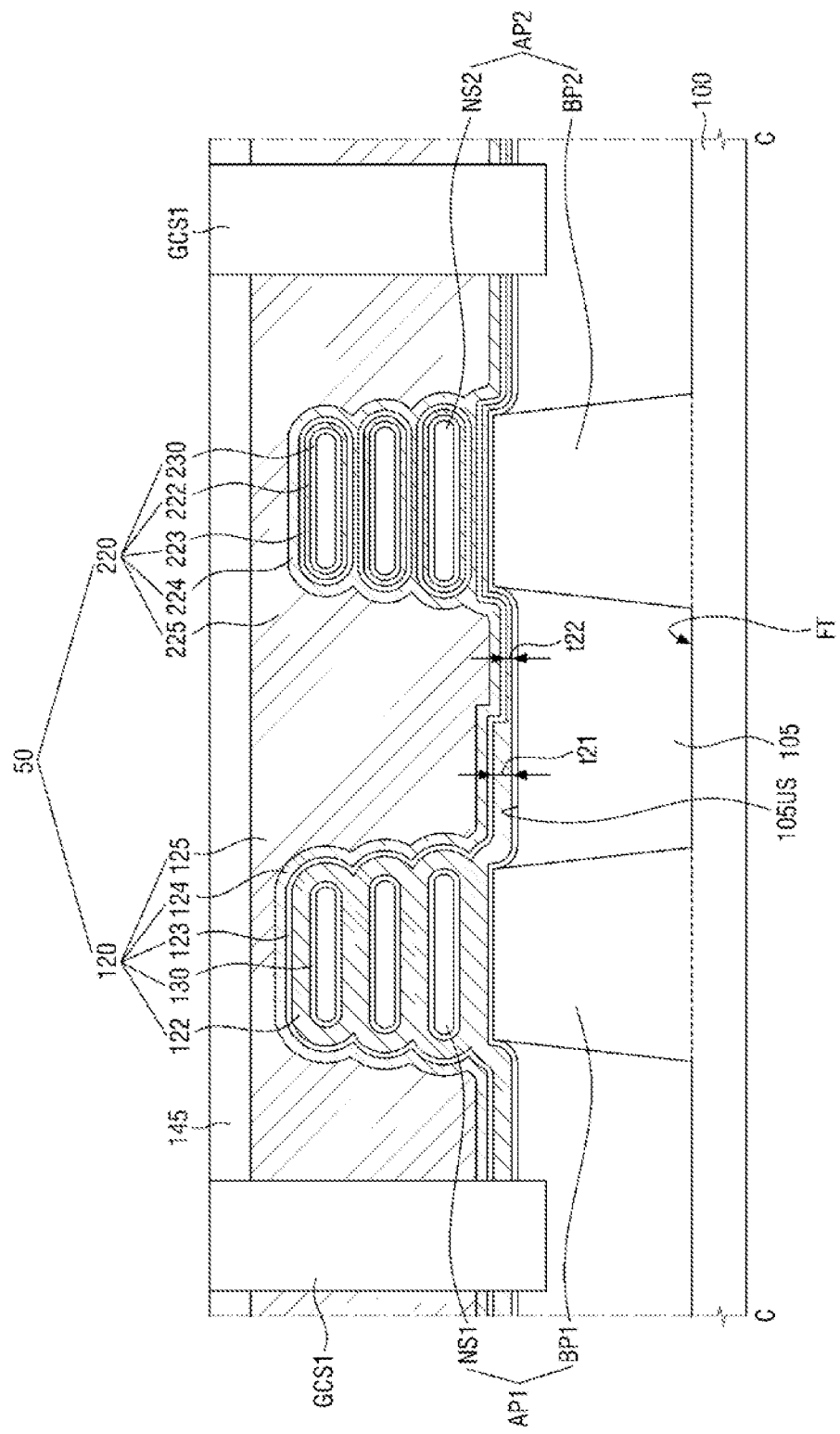
FIG. 9 is a cross-sectional view of a semiconductor device according to an embodiment of the present disclosure.

FIG. 9 is a cross-sectional view of a semiconductor device according to an embodiment of the present disclosure. For the convenience of explanation, the semiconductor device of FIG. 9 will hereinafter be described, focusing mainly on the differences with the semiconductor device of FIGS. 1 through 4B.

Referring to FIG. 9, a first lower conductive film (122 and 222) may include a (1_1)-th lower conductive film 122, which surrounds each of first sheet patterns NS1, and a (1_2)-th lower conductive film 222, which surrounds each of second sheet patterns NS2.

A first n-type gate structure 220 may include the (1_2)-th lower conductive film 222, which is disposed between a (1_2)-th gate insulating film 230 and a (1_2)-th upper insertion film 223. As the (1_2)-th upper insertion film 223 is formed on the (1_2)-th lower conductive film 222, the (1_2)-th upper insertion film 223 may not be in contact with the (1_2)-th gate insulating film 230.

In an embodiment of the present disclosure, a thickness t21 of the (1_1)-th lower conductive film 122 may be greater than a thickness t22 of the (1_2)-th lower conductive film 222. For example, the thickness t22 of the (1_2)-th lower conductive film 222 may be relatively thin, and thus the (1_2)-th lower conductive film 222 may not control a work function or provide a significant influence on the work function. Also, if there is an influence on the work function, it may be compensated by other work function films. For example, the (1_2)-th upper insertion film 223, which may be an n-type dipole layer, together with (1_2)-th upper conductive film 224, which may be an n-type work function film, may control a work function and thus may modulate the threshold voltage of the NMOS transistor.

The interface between a first p-type gate structure 120 and the first n-type gate structure 220 may be a location where the thickness of the first lower conductive film (122 and 222) changes. For example, the interface may be at a location where the thickness t21 of the (1_1)-th lower conductive film 122 is changed to the thickness t22 of the (1_2)-th lower conductive film 222. The first lower conductive film (122 and 222) may define a first stair (STR1 of FIG. 4A) at the location where the thickness of the first lower conductive film (122 and 222) changes.

Figure 10:
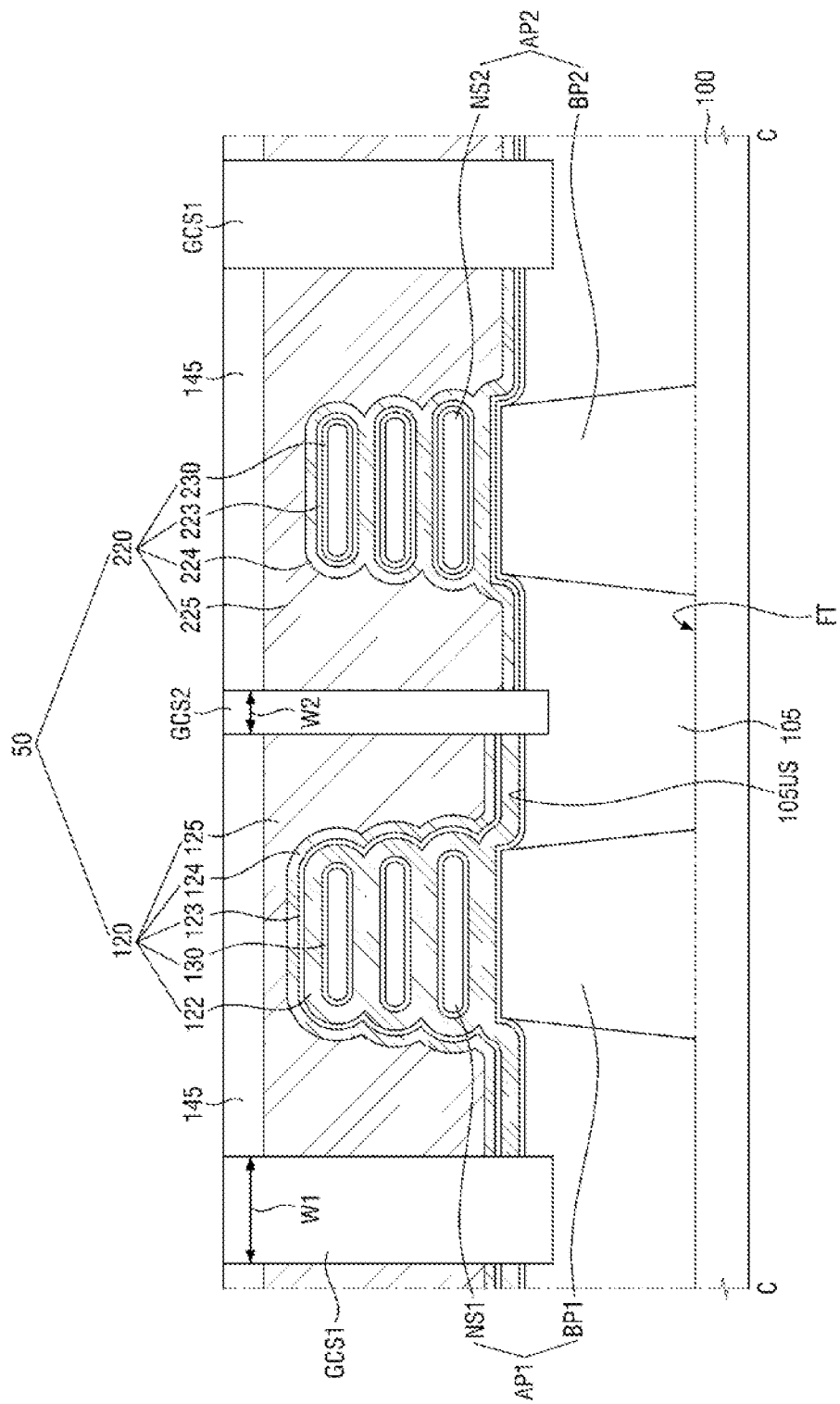
FIG. 10 is a cross-sectional view of a semiconductor device according to an embodiment of the present disclosure.
Figure 11:
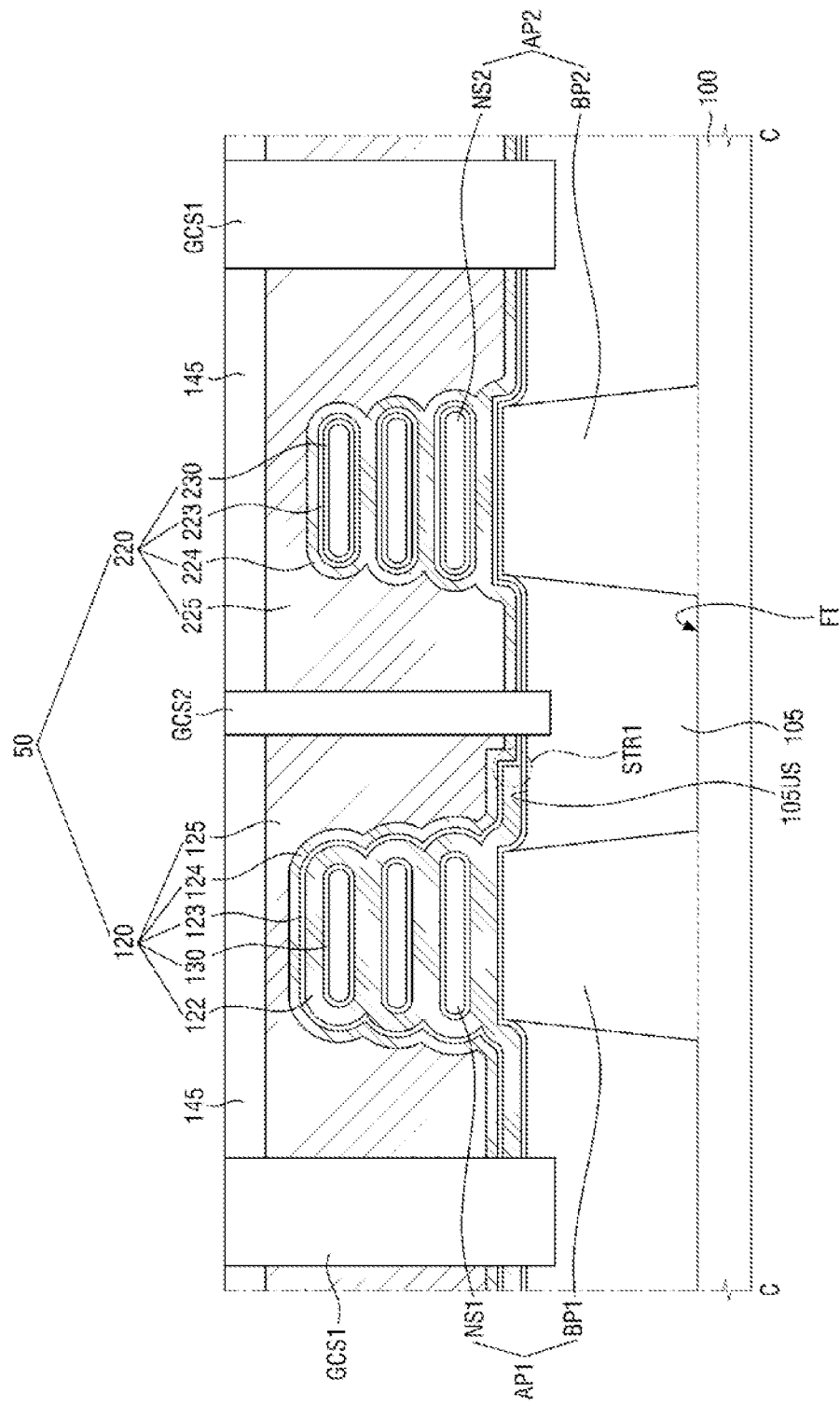
FIG. 11 is a cross-sectional view of a semiconductor device according to an embodiment of the present disclosure.
Figure 12:
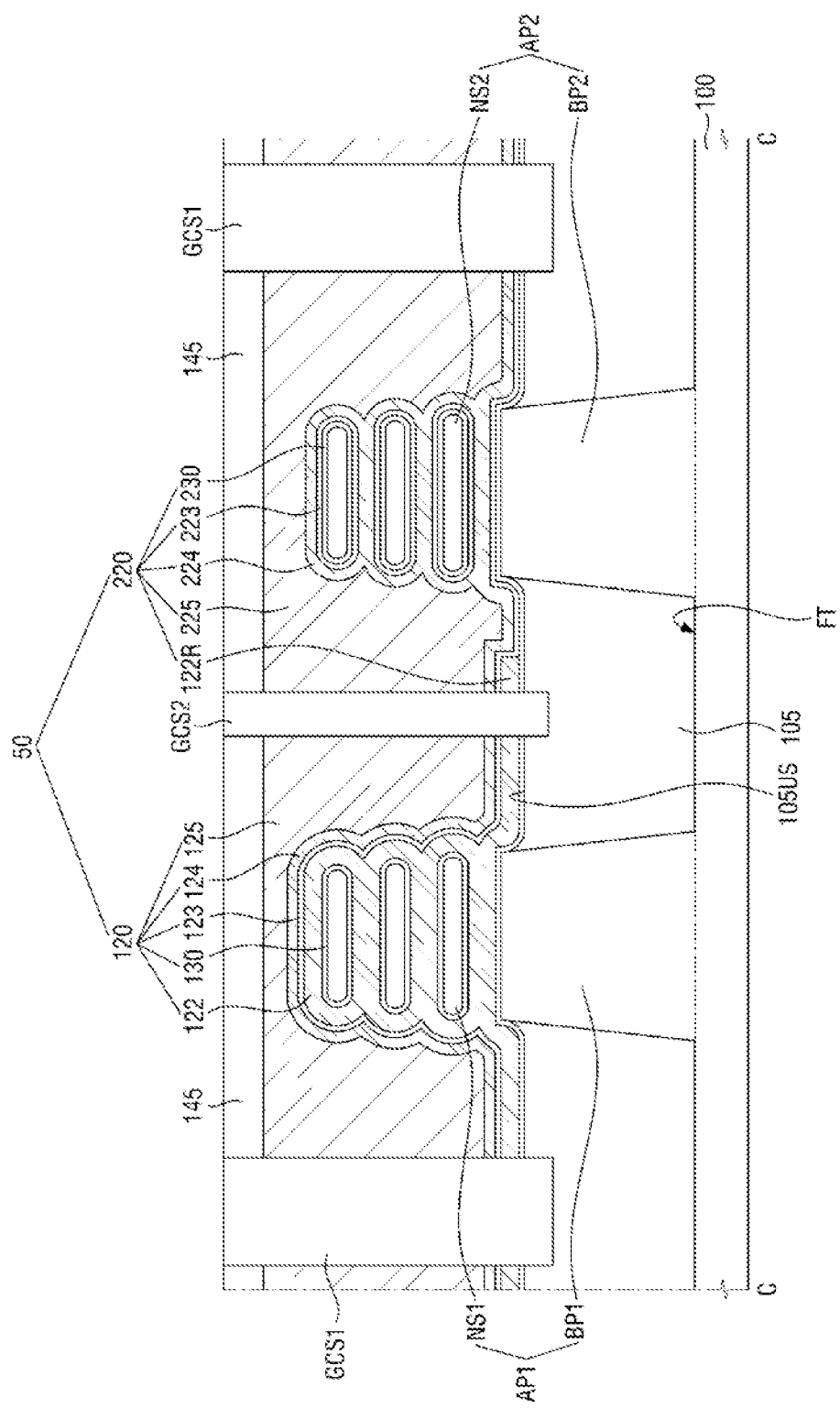
FIG. 12 is a cross-sectional view of a semiconductor device according to an embodiment of the present disclosure.

FIG. 10 is a cross-sectional view of a semiconductor device according to an embodiment of the present disclosure. FIG. 11 is a cross-sectional view of a semiconductor device according to an embodiment of the present disclosure. FIG. 12 is a cross-sectional view of a semiconductor device according to an embodiment of the present disclosure. For the convenience of explanation, the semiconductor devices of FIGS. 10 through 12 will hereinafter be described, focusing mainly on the differences with the semiconductor device of FIGS. 1 through 4B.

Referring to FIGS. 10 through 12, each of the semiconductor devices may further include a second gate cutting structure GCS2, which is disposed between a pair of adjacent first gate cutting structures GCS1 in a first direction D1.

The second gate cutting structure GCS2 may be disposed on a first field insulating film 105, between first and second active patterns AP1 and AP2.

A first gate structure 50 may be divided into a first p-type gate structure 120 and a first n-type gate structure 220 by the second gate cutting structure GCS2. That is, the second gate cutting structure GCS2 may be disposed between the first p-type gate structure 120 and the first n-type gate structure 220. The bottom surface of the second gate cutting structure GCS2 is illustrated as being closer than the boundary between the first gate insulating film (130 and 230) and the first field insulating film 105 to the substrate 100, but the present disclosure is not limited thereto. For example, the second gate cutting structures GCS2 may extend in the third direction D3, such that the bottom surface of the second gate cutting structure GCS2 may at least reach the top surface of the first gate insulating film (130 and 230) over the first field insulating film 105 to separate the first p-type gate structure 120 and the first n-type gate structure 220 in the first direction D1.

The second gate cutting structure GCS2 may include at least one of, for example, silicon nitride ($Si_3N_4$), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), aluminum oxide ($Al_2O_3$), or a combination thereof. The second gate cutting structure GCS2 is illustrated as being a single-layer film, but the present disclosure is not limited thereto.

Referring to FIG. 10, the second gate cutting structure GCS2 may be disposed in an area that overlaps with an end portion (122EP of FIG. 4A) of a first lower conductive film 122. Accordingly, the first p-type gate structure 120, unlike its counterpart of FIG. 4A, does not include a first stair STR1 formed by the first lower conductive film 122.

In an embodiment of the present disclosure, referring to FIG. 11, the second gate cutting structure GCS2 may be disposed on part of the first field insulating film 105 where the first lower conductive film 122 is not disposed. Accordingly, the first p-type gate structure 120 includes a first stair STR1 formed by the first lower conductive film 122. Also, the first p-type gate structure 120 may include a portion without the first lower conductive film 122 interposed between the first gate insulating film (130 and 230) and the first upper insertion film (123 and 223).

In an embodiment of the present disclosure, referring to FIG. 12, the second gate cutting structure GCS2 may divide part of the first lower conductive film 122 on a top surface 105US of the first field insulating film 105 into two sections. Accordingly, the first n-type gate structure 220 may include a lower conductive film pattern 122R, which is in contact with the second gate cutting structure GCS2.

Figure 13:
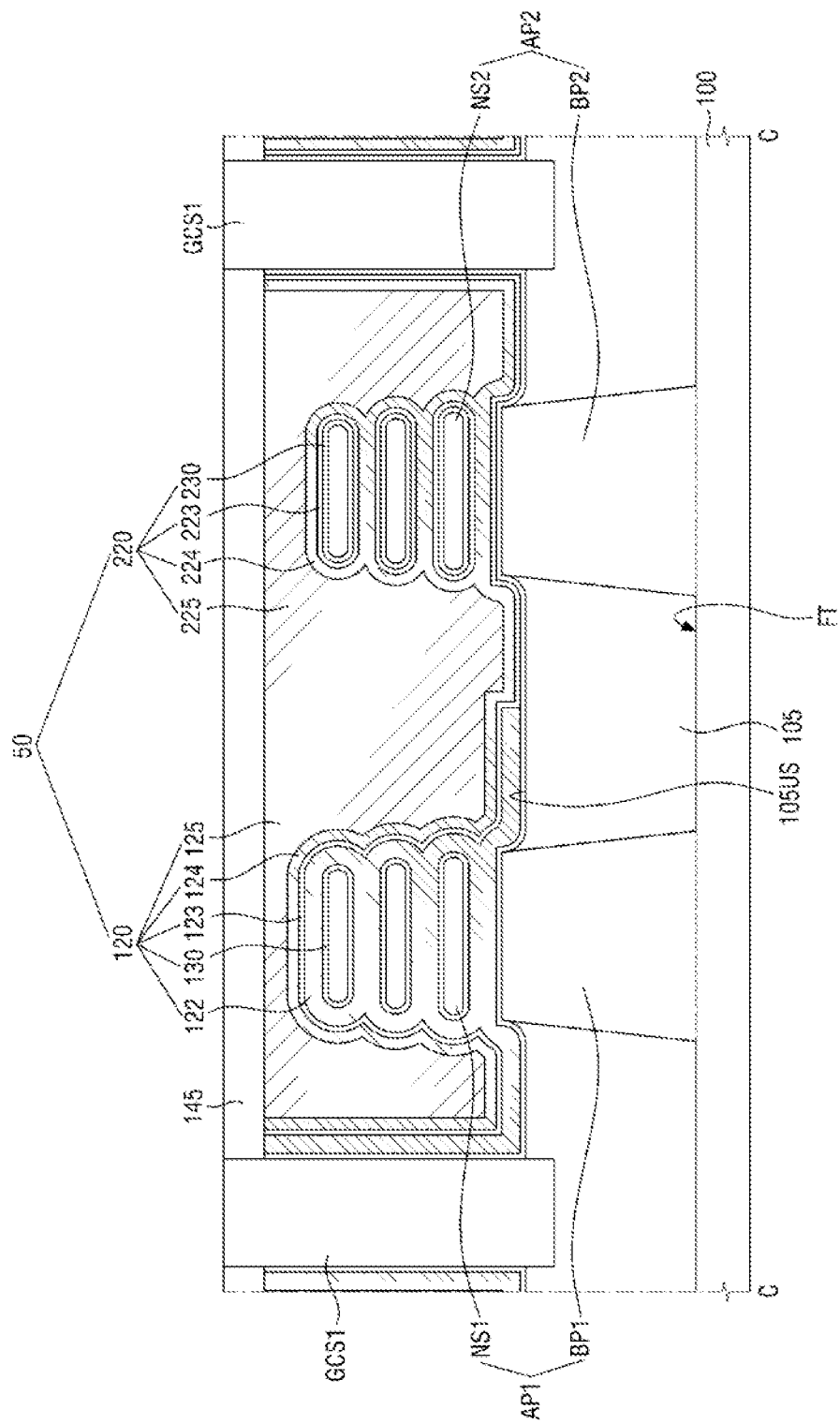
FIG. 13 is a cross-sectional view of a semiconductor device according to an embodiment of the present disclosure.

FIG. 13 is a cross-sectional view of a semiconductor device according to an embodiment of the present disclosure. For the convenience of explanation, the semiconductor device of FIG. 13 will hereinafter be described, focusing mainly on the differences with the semiconductor device of FIGS. 1 through 4B.

Referring to FIG. 13, a first gate insulating film (130 and 230), a first upper insertion film (123 and 223), and a first upper conductive film (124 and 224) may extend along the sidewalls of each of first gate cutting structures GCS1.

A first lower conductive film 122 may also extend along the sidewalls of each of the first gate cutting structures GCS1.

Figure 14:
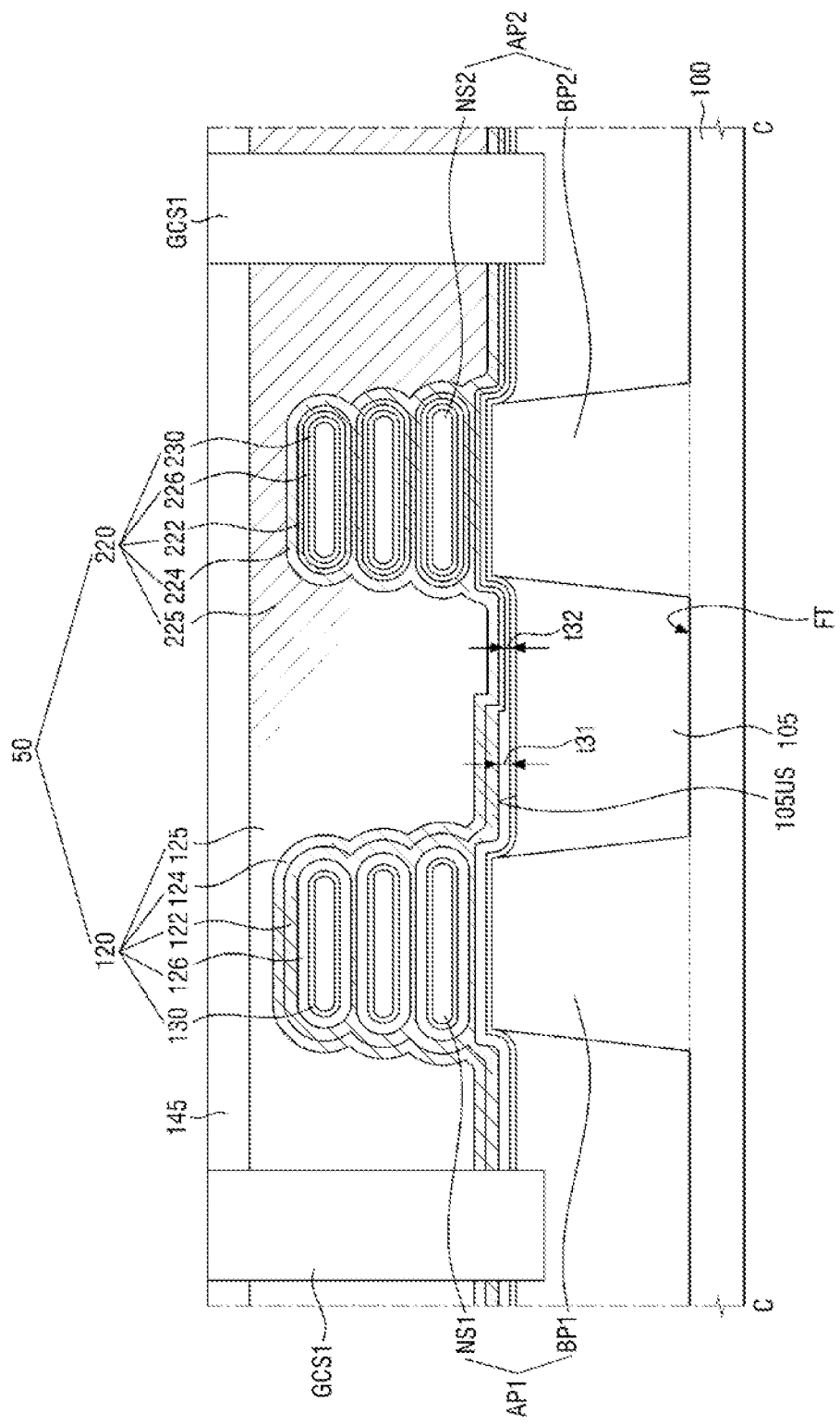
FIG. 14 is a cross-sectional view of a semiconductor device according to an embodiment of the present disclosure.

FIG. 14 is a cross-sectional view of a semiconductor device according to an embodiment of the present disclosure. For the convenience of explanation, the semiconductor device of FIG. 14 will hereinafter be described, focusing mainly on the differences with the semiconductor device of FIGS. 1 through 4B.

Referring to FIG. 14, a first gate structure 50 may include a first gate insulating film (130 and 230), a first common insertion film (126 and 226), a first lower conductive film (122 and 222), a first upper conductive film (124 and 224), and a first filling conductive film (125 and 225), which are sequentially stacked on first and second active patterns AP1 and AP2.

The first p-type gate structure 120 may include a (1_1)-th gate insulating film 130, a (1_1)-th common insertion film 126, a (1_1)-th lower conductive film 122, a (1_1)-th upper conductive film 124, and a (1_1)-th filling conductive film 125, which are sequentially stacked on the first active pattern AP1.

The first n-type gate structure 220 may include a (1_2)-th gate insulating film 230, a (1_2)-th common insertion film 226, a (1_2)-th lower conductive film 222, a (1_2)-th upper conductive film 224, and a (1_2)-th filling conductive film 225, which are sequentially stacked on the second active pattern AP2. In other words, the first active pattern AP1 may be disposed in a PMOS region, and the second active pattern AP2 may be disposed in an NMOS region.

The first common insertion film (126 and 226) may be in direct contact with the first gate insulating film (130 and 230). The first common insertion film (126 and 226) may control dipoles in the insulator in the first gate insulating film (130 and 230) and may thereby control a work function. For example, the (1_1)-th common insertion film 126 may be a p-type dipole layer to control the work function and thus to modulate the threshold voltage of the PMOS transistor. For example, the (1_1)-th common insertion film 126 may be interposed between the (1_1)-th gate insulating film 130 and the (1_1)-th lower conductive film 122, and together with the (1_1)-th lower conductive film 122, which may be a p-type work function film, may control a work function and thus may modulate the threshold voltage of the PMOS transistor.

The first common insertion film (126 and 226) may include, for example, titanium aluminum nitride (TiAlN). For example, a thickness t31 of the (1_1)-th common insertion film 126 may be greater than a thickness t32 of the (1_2)-th common insertion film 226. For example, the thickness t32 of the (1_2)-th common insertion film 226 may be relatively thin, and thus the (1_2)-th common insertion film 226 may not control a work function or provide a significant influence on the work function. Also, if there is an influence on the work function, it may be compensated by other work function films. The interface between the first p-type gate structure 120 and the first n-type gate structure 220 may be a location where the thickness of the first common insertion film (126 and 226) changes.

The (1_1)-th lower conductive film 122 and the (1_2)-th lower conductive film 222 may be formed on the same level. For example, the thickness of the (1_1)-th lower conductive film 122 may be the same as the thickness of the (1_2)-th lower conductive film 222. Alternatively, the thickness of the (1_1)-th lower conductive film 122 may be greater than the thickness of the (1_2)-th lower conductive film 222. For example, the thickness of the (1_2)-th lower conductive film 222 may be relatively thin, and thus the (1_2)-th lower conductive film 222 may not control a work function or provide a significant influence on the work function. Also, if there is an influence on the work function, it may be compensated by other work function films. The (1_2)-th upper conductive film 224, which may be a n-type work function film, disposed on the (1_2)-th lower conductive film 222 may control a work function and thus may modulate the threshold voltage of the NMOS transistor.

Figure 15:
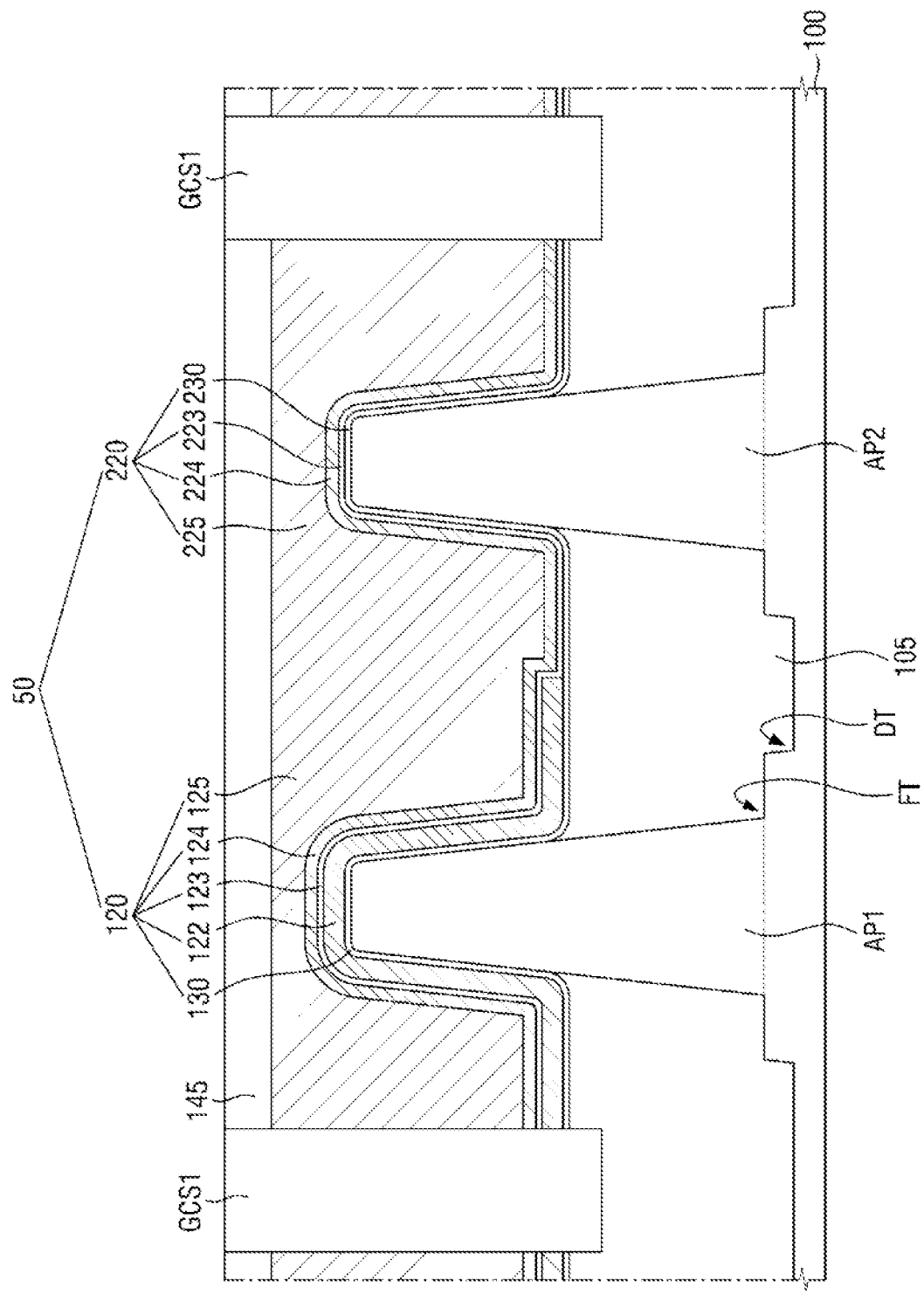
FIG. 15 is a cross-sectional view of a semiconductor device according to an embodiment of the present disclosure.

FIG. 15 is a cross-sectional view of a semiconductor device according to an embodiment of the present disclosure. For the convenience of explanation, the semiconductor device of FIG. 15 will hereinafter be described, focusing mainly on the differences with the semiconductor device of FIGS. 1 through 4B.

Referring to FIG. 15, first and second active patterns AP1 and AP2 may be fin-type patterns protruding from a substrate 100.

Parts of the first and second active patterns AP1 and AP2 may protrude upwardly beyond a top surface 105US of a first field insulating film 105.

A first gate structure 50 may cover the parts of the first and second active patterns AP1 and AP2 that protrude upwardly beyond the top surface 105US of the first field insulating film 105.

In an embodiment of the present disclosure, a deep trench DT, which is deeper than a fin trench FT, may be disposed between the first and second active patterns AP1 and AP2.

In an embodiment of the present disclosure, the deep trench DT may not be formed between the first and second active patterns AP1 and AP2. In an embodiment of the present disclosure, a dummy fin pattern with its top surface covered by the first field insulating film 105 may be disposed between the first and second active patterns AP1 and AP2.

Figure 16:
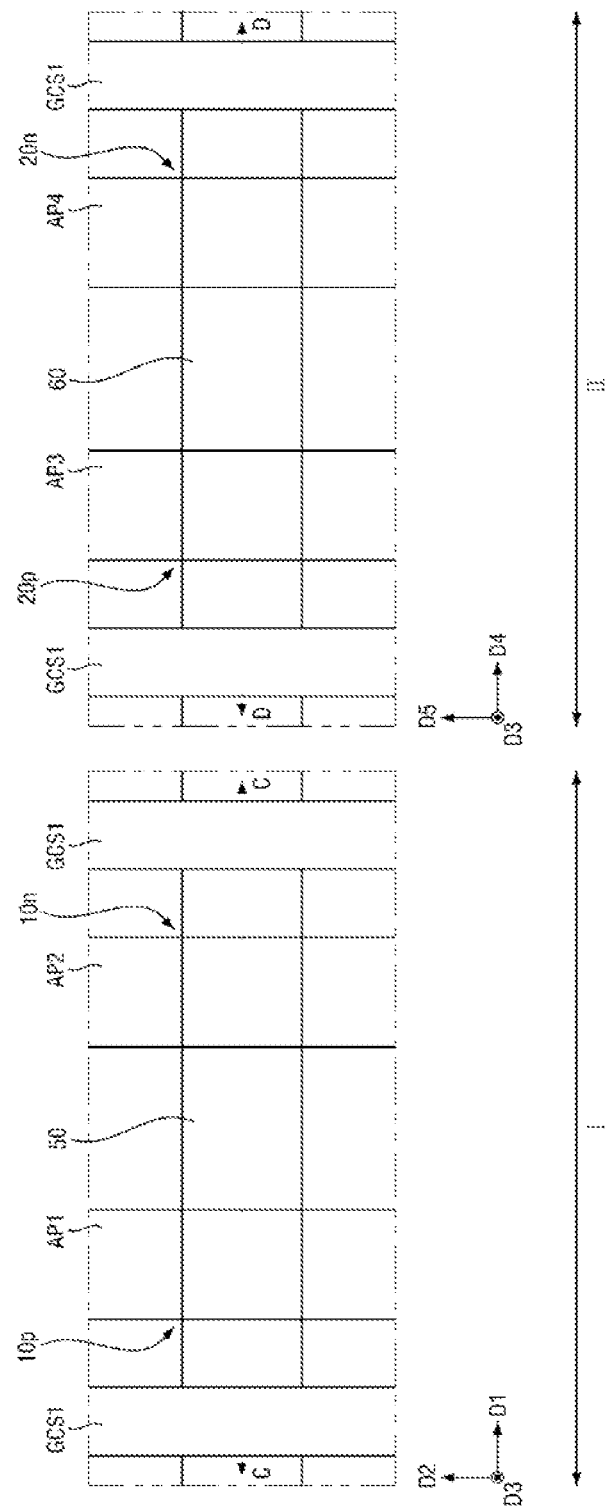
FIG. 16 is a layout view of a semiconductor device according to an embodiment of the present disclosure.
Figure 17:
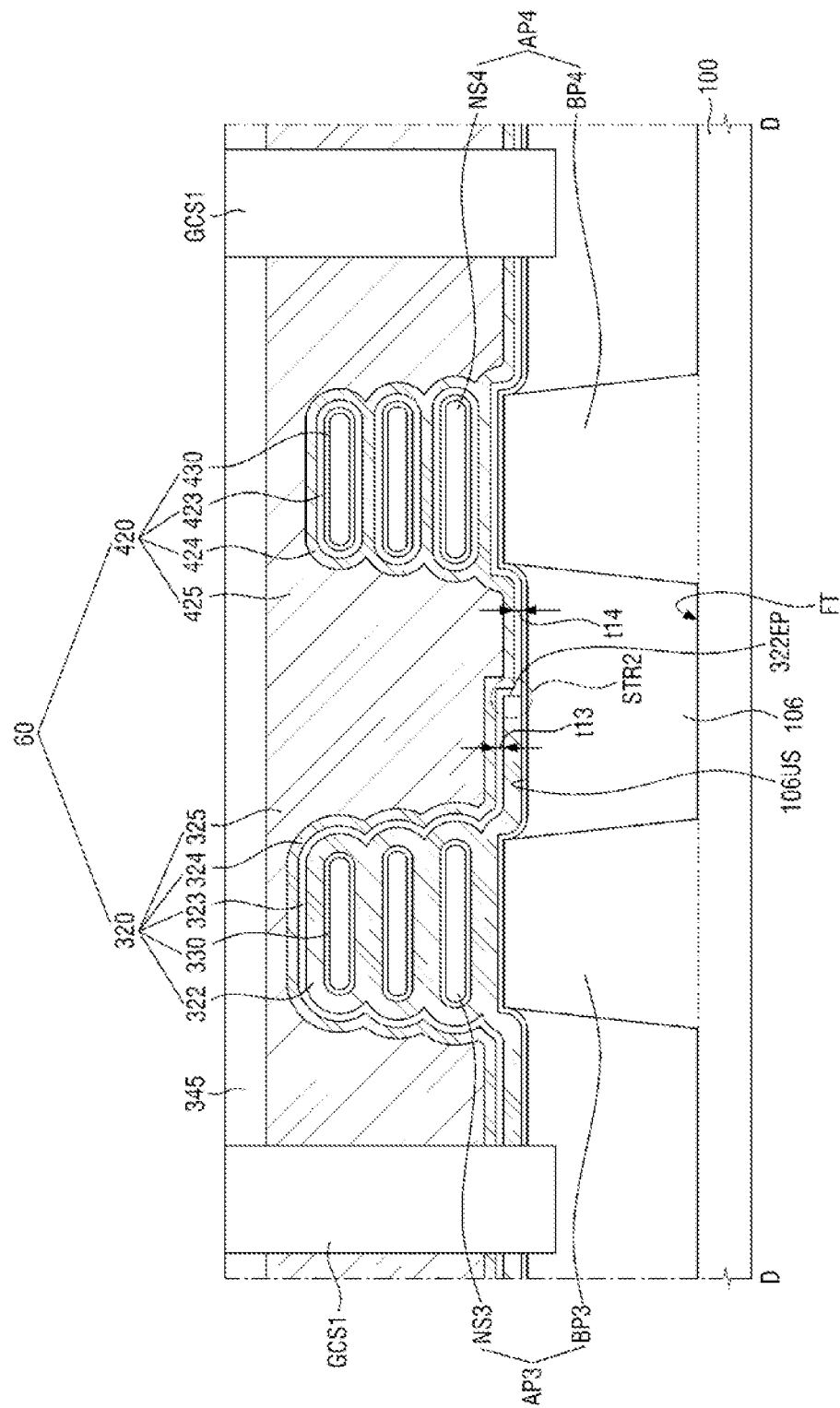
FIG. 17 is a cross-sectional view taken along line D-D of FIG. 16.

FIG. 16 is a layout view of a semiconductor device according to an embodiment of the present disclosure. FIG. 17 is a cross-sectional view taken along line D-D of FIG. 16.

A first active pattern AP1, a second active pattern AP2, and a first gate structure 50 in a first region I of FIG. 16 may be substantially the same as their respective counterparts of any one of FIGS. 1 through 13. Also, the cross-sectional view taken from the layout view of FIG. 16 may be substantially the same as any one of the cross-sectional views of FIGS. 4A through 13. Accordingly, the semiconductor device of FIGS. 16 and 17 will hereinafter be described, focusing mainly on a second region II of FIG. 16, with reference mainly to FIG. 17.

Referring to FIGS. 16 and 17, the semiconductor device may include the first active pattern AP1, the second active pattern AP2, and the first gate structure 50, which are disposed in the first region I, and a third active pattern AP3, a fourth active pattern AP4, and a second gate structure 60, which are disposed in the second region II.

A substrate 100 may include the first and second regions I and II. In an embodiment of the present disclosure, the first and second regions I and II may be logic regions. In an embodiment of the present disclosure, the first and second regions I and II may be SRAM regions. In an embodiment of the present disclosure, one of the first and second regions I and II may be a logic region, and the other region may be an SRAM region.

The third and fourth active patterns AP3 and AP4 may be disposed on the substrate 100. The third and fourth active patterns AP3 and AP4 may extend in a fifth direction D5, and may be adjacent to each other in a fourth direction D4. The fifth direction D5 may be a direction intersecting the fourth direction D4. The third active pattern AP3 may be a region in which a PMOS is formed, and the fourth active pattern AP4 may be a region in which an NMOS is formed.

The third active pattern AP3 may include a third lower pattern BP3 and a plurality of third sheet patterns NS3. The fourth active pattern Ap4 may include a fourth lower pattern BP4 and a plurality of fourth sheet patterns NS4. The third lower pattern BP3 may be spaced apart from the fourth lower pattern BP4 in the fourth direction D4. The third and fourth lower patterns BP3 and BP4 may be separated from each other by a fin trench FT, which extends in the fifth direction D5.

The third sheet patterns NS3 may be disposed on the third lower pattern BP3, and may be spaced apart from the third lower pattern BP3 in the third direction D3. The fourth sheet patterns NS4 may be disposed on the fourth lower pattern BP4, and may be spaced apart from the fourth lower pattern BP4 in the third direction D3. The third and fourth lower patterns BP3 and BP4 may be formed by partially removing an upper portion of the substrate 100, and thus may be integrally formed with the substrate 100, but the present disclosure is not limited thereto.

A second field insulating film 106 may be formed on the substrate 100. The second field insulating film 106 may be disposed on the substrate 100, between the third and fourth active patterns AP3 and AP4, and may be in direct contact with the third and fourth active patterns AP3 and AP4. The second field insulating film 106 may be disposed between the third and fourth lower patterns BP3 and BP4, and may be in direct contact with the third and fourth lower patterns BP3 and BP4. The second field insulating film 106 may include, for example, an oxide film, a nitride film, an oxynitride film, or a combination thereof.

The second gate structure 60 may be formed on the substrate 100, and may be disposed on the second field insulating film 106. The second gate structure 60 may extend in the fourth direction D4, and may intersect the third active pattern AP3, the fourth active pattern AP4, and the second field insulating film 106.

The second gate structure 60 may intersect the third and fourth lower patterns BP3 and BP4, and may surround each of the third sheet patterns NS3 and each of the fourth sheet patterns NS4.

The second gate structure 60 may include a second p-type gate structure 320 and a second n-type gate structure 420.

The second p-type gate structure 320 may be formed on the third active pattern AP3, and may intersect the third active pattern AP3. The second p-type gate structure 320 may intersect the third lower pattern BP3, and may surround each of the third sheet patterns NS3.

The second n-type gate structure 420 may be formed on the fourth active pattern AP4, and may intersect the fourth active pattern AP4. The second n-type gate structure 420 may intersect the fourth lower pattern BP4, and may surround each of the fourth sheet patterns NS4.

A second p-type transistor 20p may be defined in a region where the second p-type gate structure 320 and the third active pattern AP3 intersect each other, and a second n-type transistor 20n may be defined in a region where the second n-type gate structure 420 and the fourth active pattern AP4 intersect each other. Also, third epitaxial patterns 550 to be described may be included in the source/drain of the second p-type transistor 20p, and fourth epitaxial patterns 650 to be described may be included in the source/drain of the second n-type transistor 20n.

The second gate structure 60 may include a second gate insulating film (330 and 430), a second lower conductive film 322, a second upper insertion film (323 and 423), a second upper conductive film (324 and 424), and a second filling conductive film (325 and 425).

The second p-type gate structure 320 may include a (2_1)-th gate insulating film 330, the second lower conductive film 322, a (2_1)-th upper insertion film 323, a (2_1)-th upper conductive film 324, and a (2_1)-th filling conductive film 325. The second n-type gate structure 420 may include a (2_2)-th gate insulating film 430, a (2_2)-th upper insertion film 423, a (2_2)-th upper conductive film 424, and a (2_2)-th filling conductive film 425.

The second p-type gate structure 320 and the second n-type gate structure 420 may be substantially the same as the first p-type gate structure 120 and the first n-type gate structure 220, respectively, of FIGS. 1 through 4B, and thus, detailed descriptions thereof will be omitted.

The second lower conductive film 322 may include an end portion 322EP, which is disposed on a top surface 106US of the second field insulating film 106, between the third and fourth active patterns AP3 and AP4. The second lower conductive film 322 may define a second stair STR2 on the top surface 106US of the second field insulating film 106, between the third and fourth active patterns AP3 and AP4. The second stair STR2 may have a stair shape formed by the end portion 322EP of the second lower conductive film 322. The end portion 322EP of the second lower conductive film 322 may be disposed near the center of the second field insulating film 106 between the third and fourth active patterns AP3 and AP4 in the first direction D1, but the present disclosure is not limited thereto. For example, the end portion 322EP of the second lower conductive film 322 may be at a location closer to the third lower pattern BP3 than to the fourth lower pattern BP4 or closer to the fourth lower pattern BP4 than to the third lower pattern BP3 depending on a circuit design and/or a manufacturing process.

The second stair STR2 may be located on the interface between the second p-type gate structure 320 and the second n-type gate structure 420.

The second upper insertion film (323 and 423) may be disposed on the second lower conductive film 322. For example, the second upper insertion film (323 and 423) may be in direct contact with the second lower conductive film 322. The second upper insertion film (323 and 423) may be disposed across the third and fourth active patterns AP3 and AP4.

In an embodiment of the present disclosure, a thickness t13 of the (2_1)-th upper insertion film 323 may be the same as a thickness t14 of the (2_2)-th upper insertion film 423. In an embodiment of the present disclosure, the thickness t13 of the (2_1)-th upper insertion film 323 may be different from the thickness t14 of the (2_2)-th upper insertion film 423. The amount by which the work function is to be controlled may vary depending on the thickness t13 of the (2_1)-th upper insertion film 323 and thickness t14 of the (2_2)-th upper insertion film 423.

Referring to FIGS. 4A and 17, the thickness t14 of the (2_2)-th upper insertion film 423 may be different from a thickness t12 of the (1_2)-th upper insertion film 223.

A second gate capping pattern 345 may be disposed on the second gate structure 60.

In an embodiment of the present disclosure, the cross-sectional view taken from the layout view of FIG. 16 may be substantially the same as one of the cross-sectional views of FIGS. 5 through 13. In an embodiment of the present disclosure, the first, second, third, and fourth active patterns AP1, AP2, AP3, and AP4 may be fin-type patterns described above with reference to FIG. 15.

Figure 18:
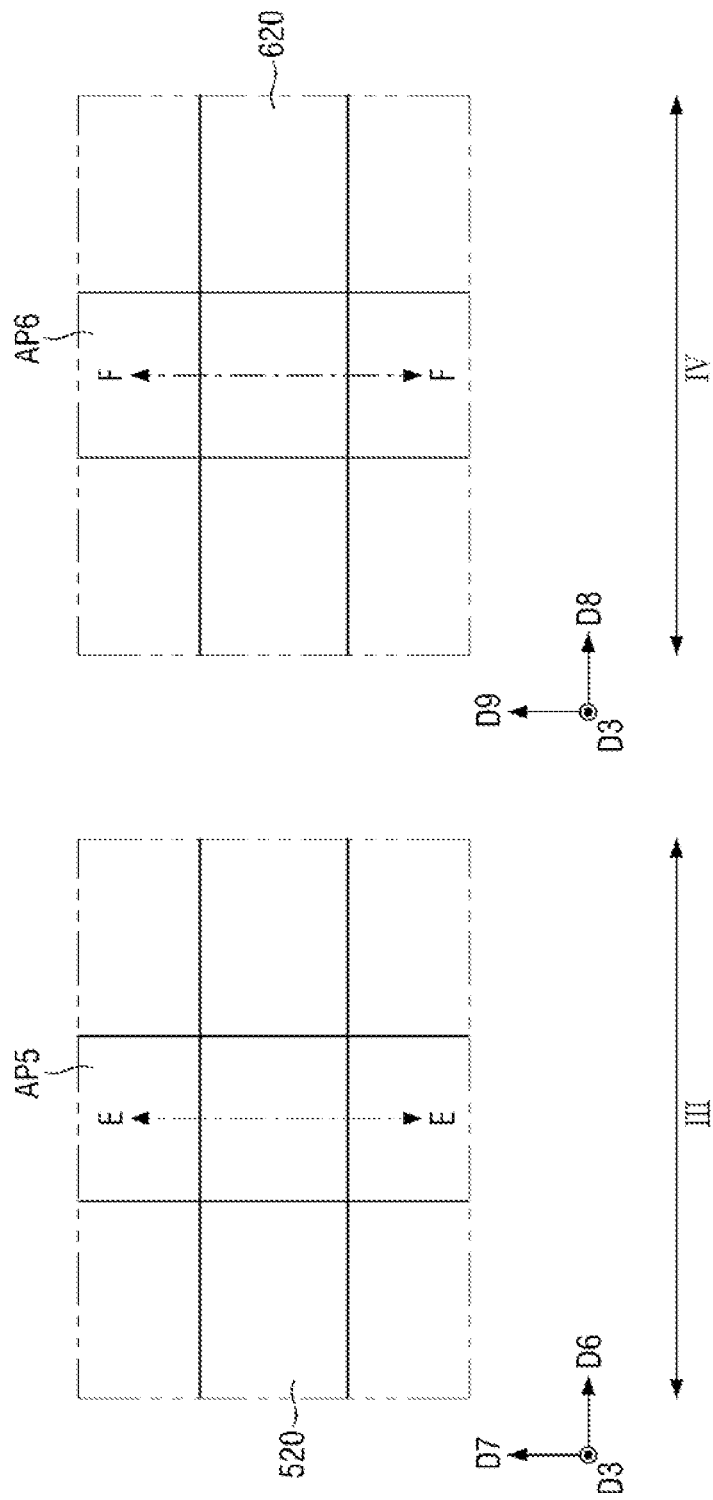
FIG. 18 is a layout view of a semiconductor device according to an embodiment of the present disclosure.
Figure 20:
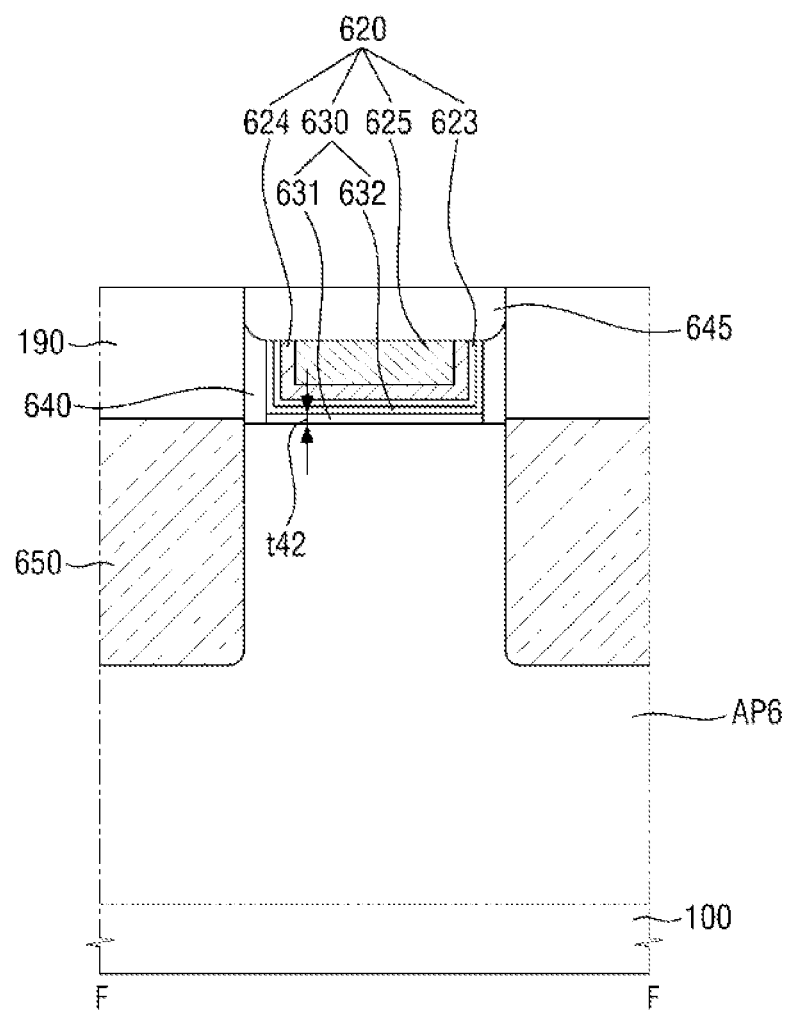
FIGS. 20 and 21 are cross-sectional views taken along line F-F of FIG. 18.
Figure 21:
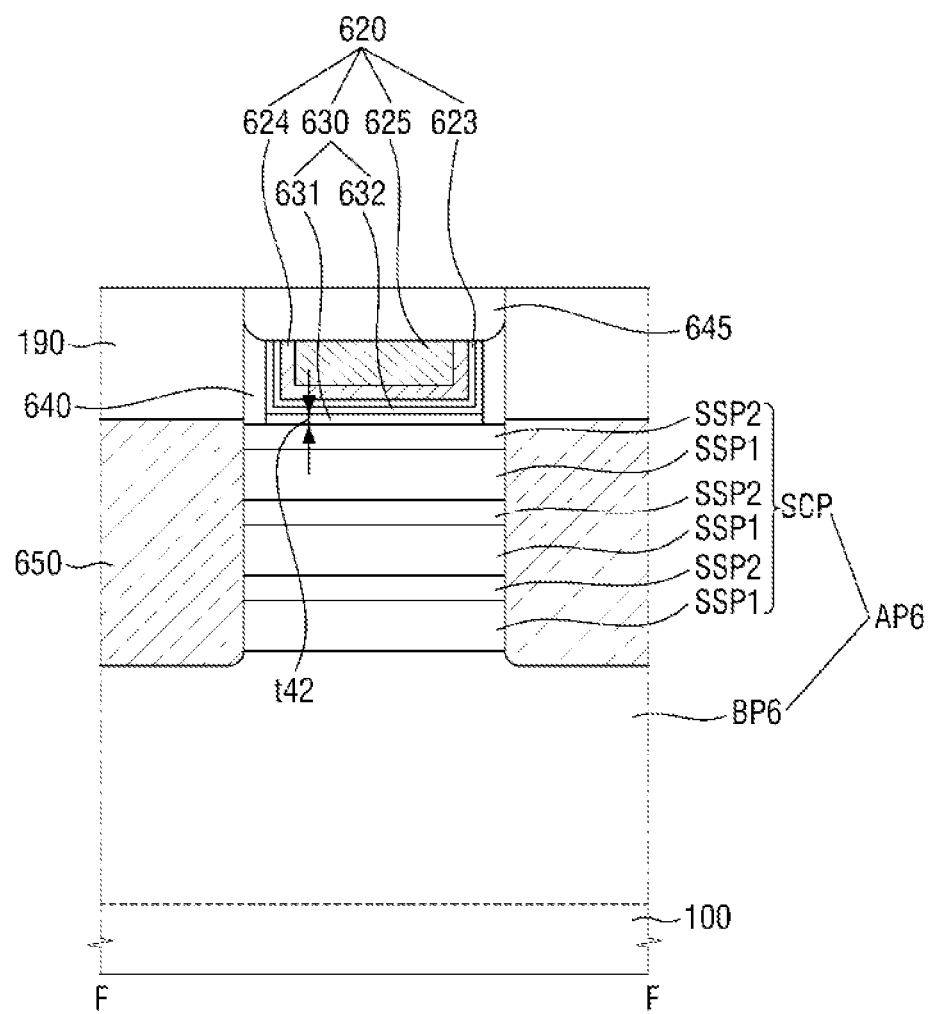

FIG. 18 is a layout view of a semiconductor device according to an embodiment of the present disclosure. FIG. 19 is a cross-sectional view taken along line E-E of FIG. 18. FIGS. 20 and 21 are cross-sectional views taken along line F-F of FIG. 18.

Referring to FIGS. 18 through 21, the semiconductor device may include a fifth active pattern AP5 and a third gate structure 520, which are disposed in a third region III, and a sixth active pattern AP6 and a fourth gate structure 620, which are disposed in a fourth region IV.

A substrate may include the third and fourth regions III and IV. For example, the third region III may be a logic region or an SRAM region. The fourth region IV may be an input/output (I/O) region.

The fifth active pattern AP5 may be disposed on the substrate 100, and may extend in a seventh direction D7. The fifth active pattern AP5 may include a fifth lower pattern BP5 and fifth sheet patterns NS5, which are spaced apart from the fifth lower pattern BP5 in a third direction D3. The fifth active pattern AP5 may be substantially the same as the first and second active patterns AP1 or AP2 of any one of FIGS. 1 through 13.

The third gate structure 520 may intersect the fifth active pattern AP5, and may extend in a sixth direction D6. The sixth direction D6 may be a direction intersecting the seventh direction D7. The third gate structure 520 may include a third gate insulating film 530, a third upper insertion film 523, a third upper conductive film 524, and a third upper filling film 525, which are sequentially stacked on the fifth active pattern AP5. The third gate insulating film 530 may include a third interface film 531 and a third high-k dielectric film 532. The third interface film 531 may include, for example, a silicon oxide ($SiO_2$) film, but the present disclosure is not limited thereto.

The sixth active pattern AP6 may be disposed on the substrate 100, and may extend in a ninth direction D9. The sixth active pattern AP6 may be a fin-type pattern described above with reference to FIG. 15.

Referring to FIG. 20, in an embodiment of the present disclosure, the sixth active pattern AP6 may be a fin-type pattern formed as a single semiconductor film. Referring to FIG. 21, in an embodiment of the present disclosure, the sixth active pattern AP6 may include a sixth lower pattern BP6 and a semiconductor stack pattern SCP. The semiconductor stack pattern SCP may include first semiconductor patterns SSP1 and second semiconductor patterns SSP2, which are alternately stacked. For example, the first semiconductor patterns SSP1 may include a semiconductor material the same as that of sacrificial semiconductor patterns that are formed during the formation of the fifth sheet patterns NS5. The second semiconductor patterns SSP2 may include a material the same as that of the fifth sheet patterns NS5. The first semiconductor patterns SSP1 may include a material having an etching selectivity with respect to the substrate 100 and the second semiconductor patterns SSP2. In an embodiment of the present disclosure, the first semiconductor patterns SSP1 may include SiGe, and the second semiconductor patterns SSP2 may include Si.

The fourth gate structure 620 may intersect the sixth active pattern AP6, and may extend in an eighth direction D8. The eighth direction D8 may be a direction intersecting the ninth direction D9. The fourth gate structure 620 may include a fourth gate insulating film 630, a fourth upper insertion film 623, a fourth upper conductive film 624, and a fourth upper filling film 625, which are sequentially stacked on the sixth active pattern AP6. The fourth gate insulating film 630 may include a fourth interface film 631 and a fourth high-k dielectric film 632. The fourth interface film 631 may include, for example, a silicon oxide ($SiO_2$) film, but the present disclosure is not limited thereto. For example, a thickness t42 of the fourth interface film 631 may be greater than a thickness t41 of the third interface film 531.

The third and fourth gate structures 520 and 620 may be substantially the same as the first n-type gate structure 220 of FIGS. 3 through 4B, and thus, detailed descriptions thereof will be omitted.

In an embodiment of the present disclosure, the third and fourth gate structures 520 and 620 may further include a lower conductive film corresponding to the first lower conductive film 122 illustrated in FIG. 4B and/or a lower insertion film corresponding to the first lower insertion film 121 illustrated in FIG. 5.

In an embodiment of the present disclosure, the fourth gate structure 620 may not include the fourth upper insertion film 623, which includes an aluminum nitride (AlN) film.

Second gate spacers 540 may be disposed on the sidewalls of the third gate structure 520. For example, the second gate spacers 540 may include second outer spacers 541 and second inner spacers 542, but the present disclosure is not limited thereto.

Third gate spacers 640 may be disposed on the sidewalls of the fourth gate structure 620.

A third gate capping pattern 545 may be disposed on the third gate structure 520 and the second gate spacers 540. A fourth gate capping pattern 645 may be disposed on the fourth gate structure 620 and the third gate spacers 640.

Third epitaxial patterns 550 may be disposed on the fifth lower pattern BP5, and may be disposed on at least one side of the third gate structure 520. Fourth epitaxial patterns 650 may be disposed on the sixth active pattern AP6, and may be disposed on at least one side of the fourth gate structure 620. The third epitaxial patterns 550 may be electrically connected to the fifth sheet patterns NS5 and the fifth lower pattern BP5, and electrically insulated from the third gate structure 520 by the third gate insulating film 530 and the second gate spacers 540. The fourth epitaxial patterns 650 may be electrically connected to the sixth active pattern AP6 (or the sixth lower pattern BP6 and the semiconductor stack pattern SCP), and electrically insulated from the fourth gate structure 620 by the fourth gate insulating film 630 and the third gate spacers 640.

Figure 22:
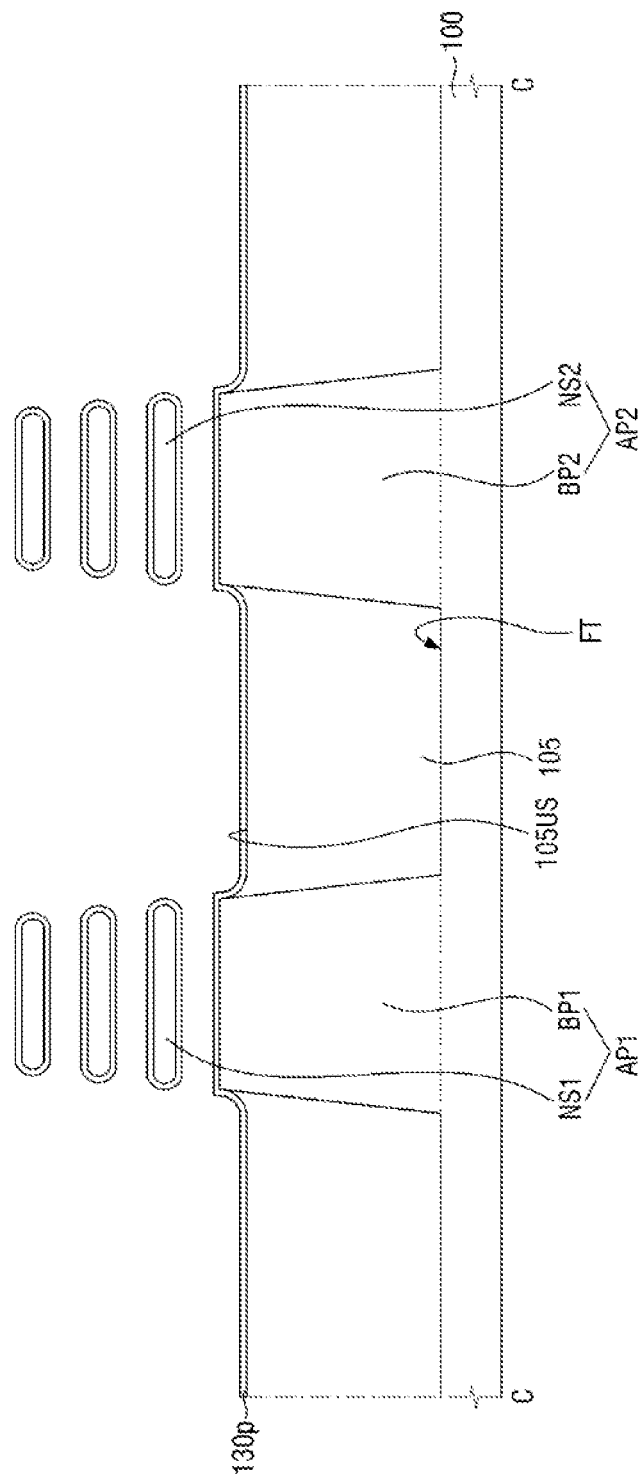
Figure 23:
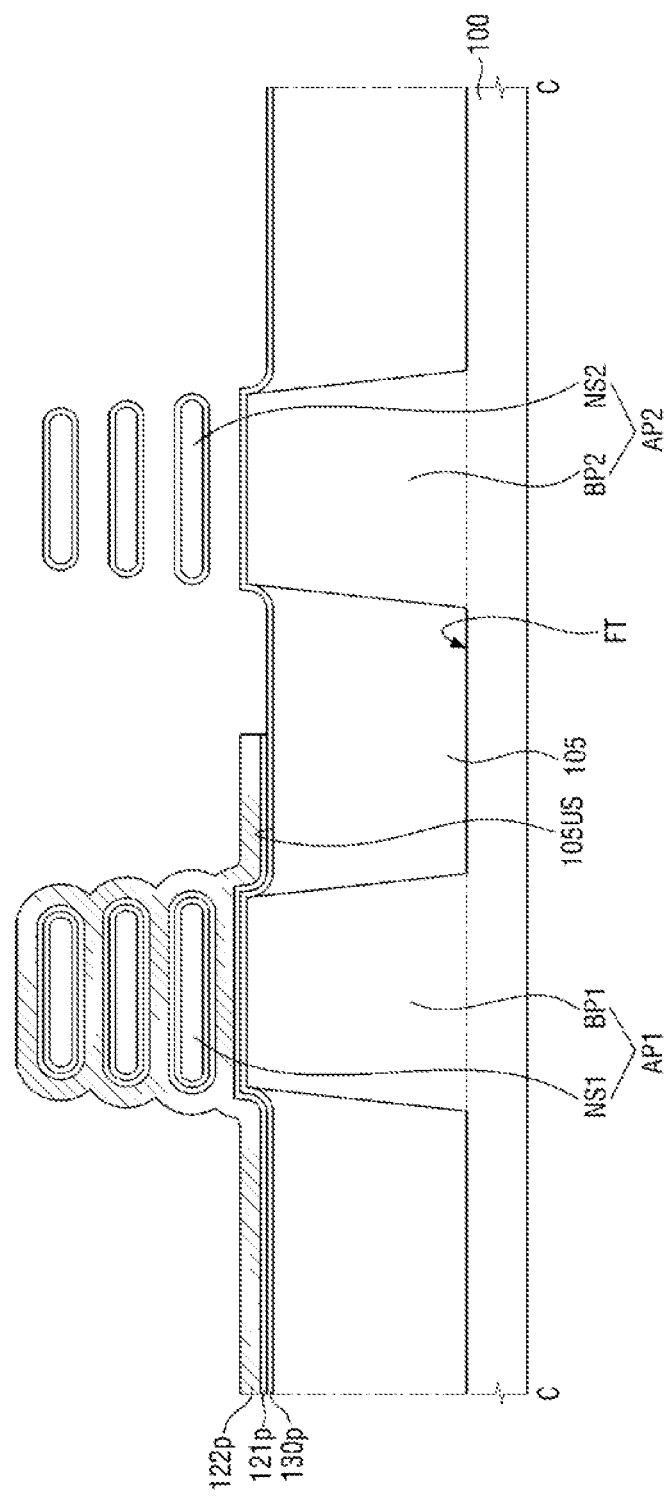

FIGS. 22 through 24 are cross-sectional views illustrating a method of fabricating a semiconductor device according to an embodiment of the present disclosure.

In detail, FIGS. 22 through 24 are cross-sectional views taken along line C-C of FIG. 1.

Referring to FIG. 22, first and second active patterns AP1 and AP2 may be formed on a substrate 100 to be spaced apart from each other.

The first active pattern AP1 may include a first lower pattern BP1 and first sheet patterns NS1. The second active pattern AP2 may include a second lower pattern BP2 and second sheet patterns NS2.

A first field insulating film 105 may cover at least parts of sidewalls of the first lower pattern BP1 that define the fin trench FT and at least parts of sidewalls of the second lower pattern BP2 that define the fin trench FT. For example, part of the first lower pattern BP1 and/or part of the second lower pattern BP2 may protrude beyond a top surface 105US of the first field insulating film 105 in the third direction D3.

A pre-gate insulating film 130p may extend along a top surface 105US of the first field insulating film 105, the top surface of the first lower pattern BP1, and the top surface of the second lower pattern BP2. The pre-gate insulating film 130p may be formed along the circumferences of the first sheet patterns NS1 and along the circumferences of the second sheet patterns NS2.

The pre-gate insulating film 130p may correspond to the first gate insulating film (130 and 230) of FIG. 4A.

Referring to FIG. 23, a pre-lower insertion film 121p and a pre-lower conductive film 122p may be formed on the first active pattern AP1. The pre-lower insertion film 121p and the pre-lower conductive film 122p may be formed on the pre-gate insulating film 130p. The pre-lower insertion film 121p may surround each of first sheet patterns NS1, and may be disposed along the circumferences of the first sheet patterns NS1. The pre-lower conductive film 122p may be formed on the pre-lower insertion film 121p, and may generally fill the spaces between the first lower pattern BP1 and the first sheet patterns NS1 and between the first sheet patterns NS1.

The pre-lower insertion film 121p and the pre-lower conductive film 122p may not be formed on the second active pattern AP2.

The pre-lower insertion film 121p and the pre-lower conductive film 122p may be formed on the first and second active patterns AP1 and AP2. Thereafter, parts of the pre-lower insertion film 121p and the pre-lower conductive film 122p on the second active pattern AP2 may be removed.

In an embodiment of the present disclosure, the pre-lower insertion film 121p may not be formed between the pre-gate insulating film 130p and the pre-lower conductive film 122p.

The pre-lower insertion film 121p may correspond to the first lower insertion film 121 of FIG. 5, and the pre-lower conductive film 122p may correspond to the first lower conductive film 122 of FIG. 5.

Referring to FIG. 24, after the formation of the pre-lower conductive film 122p, a pre-upper insertion film 123p and a pre-upper conductive film 124p may be sequentially formed on the first and second active patterns AP1 and AP2.

The pre-upper insertion film 123p may correspond to the first upper insertion film (123 and 223) of FIG. 5, and the pre-upper conductive film 124p may correspond to the first upper conductive film (124 and 224) of FIG. 5.

Thereafter, a pre-filling conductive film may be formed on the pre-upper conductive film 124p, and the first gate cutting structures GCS1 of FIG. 5 may be formed. As a result, the first gate structure 50 of FIG. 5 may be obtained.

In concluding the detailed description, those skilled in the art will appreciate that many variations and modifications may be made to the specific embodiments described herein without departing from the spirit and scope of the present disclosure as defined in the appended claims. Therefore, the disclosed embodiments of the present disclosure are used in a generic and descriptive sense only and not for purposes of limitation.

What is claimed is:

1. A semiconductor device comprising:
a first active pattern and a second active pattern disposed on a substrate and being adjacent to each other;
a field insulating film disposed on the substrate, between the first active pattern and the second active pattern, and being in direct contact with the first active pattern and the second active pattern;
a first gate structure intersecting the first active pattern, on the substrate; and
a second gate structure intersecting the second active pattern, on the substrate,
wherein
the first gate structure includes a first gate insulating film, which is on the first active pattern, a first upper insertion film, which is on the first gate insulating film, and a first upper conductive film, which is on the first upper insertion film and in contact with the first upper insertion film,
the second gate structure includes a second gate insulating film, which is on the second active pattern, a second upper insertion film, which is on the second gate insulating film, and a second upper conductive film, which is on the second upper insertion film and in contact with the second upper insertion film,
each of the first upper insertion film and the second upper insertion film is an aluminum nitride film,
each of the first upper conductive film and the second upper conductive film includes aluminum,
the first upper insertion film is not in contact with the first gate insulating film,
the first upper conductive film is over the first upper insertion film, but not interposed between two adjacent separate portions of the first upper insertion film,
the second upper conductive film is over the second upper insertion film, and interposed between two adjacent separate portions of the second upper insertion film,
the second upper insertion film is in direct contact with the second gate insulating film,
the first gate structure further includes a lower insertion film and a lower conductive film, with the aluminum nitride film of the first upper insertion film disposed between the lower insertion film and the first upper conductive film and spaced apart from the lower insertion film on the first active pattern, the lower conductive film directly contacting the first upper insertion film and the lower insertion film, and the lower insertion film including a nitride or an oxide of a metal having an electronegativity of about 1.5 or higher,
the first active pattern is disposed in a p-type metal-oxide semiconductor (PMOS) region, and
the second active pattern is disposed in an n-type metal-oxide semiconductor (NMOS) region.

2. The semiconductor device of claim 1, wherein the lower conductive film is disposed between the first upper insertion film and the first gate insulating film.

3. The semiconductor device of claim 1, wherein
the lower insertion film is disposed between the first gate insulating film and the first upper insertion film.

4. The semiconductor device of claim 3, wherein the lower insertion film includes at least one of molybdenum oxide, molybdenum nitride, niobium oxide, niobium nitride, nickel oxide, tin oxide, or titanium oxide.

5. The semiconductor device of claim 3, wherein the lower insertion film is not formed on the second active pattern.

6. The semiconductor device of claim 1, wherein
the first upper insertion film and the second upper insertion film are in direct contact with each other, and
the first upper conductive film and the second upper conductive film are in direct contact with each other.

7. The semiconductor device of claim 6, wherein
the lower insertion film and the lower conductive film are disposed between the first gate insulating film and the first upper insertion film, and
an end portion of the lower insertion film and an end portion of the lower conductive film are disposed on a top surface of the field insulating film.

8. The semiconductor device of claim 1, wherein each of the first active pattern and the second active pattern includes a lower pattern, which protrudes from the substrate, and sheet patterns, which are spaced apart from the lower pattern.

9. A semiconductor device comprising:
a first active pattern and a second active pattern disposed on a substrate and being adjacent to each other;
a field insulating film disposed on the substrate, between the first active pattern and the second active pattern, and being in direct contact with the first active pattern and the second active pattern; and
a gate structure intersecting the first active pattern and the second active pattern, on the field insulating film,
wherein
the gate structure includes a gate insulating film, which is disposed on the first active pattern and the second active pattern, a lower conductive film, which is disposed on part of the gate insulating film on the first active pattern and defines a stair on a top surface of the field insulating film, an aluminum nitride film, which is disposed on the lower conductive film, across the first active pattern and the second active pattern, and an upper conductive film, which is disposed on the aluminum nitride film, across the first active pattern and the second active pattern, and includes aluminum,
the gate structure further includes a lower insertion film on the first active pattern, with the aluminum nitride film disposed between the lower insertion film and the upper conductive film and spaced apart from the lower insertion film on the first active pattern, the lower conductive film directly contacting the aluminum nitride film and the lower insertion film, and the lower insertion film including a nitride or an oxide of a metal having an electronegativity of about 1.5 or higher,
the upper conductive film is over the aluminum nitride film, but not interposed between two adjacent separate portions of the aluminum nitride film on the first active pattern,
the upper conductive film is over the aluminum nitride film, and interposed between two adjacent separate portions of the aluminum nitride film on the second active pattern,
the aluminum nitride film is in direct contact with the gate insulating film, on the second active pattern,
the first active pattern is disposed in a p-type metal-oxide semiconductor (PMOS) region, and
the second active pattern is disposed in an n-type metal-oxide semiconductor (NMOS) region.

10. The semiconductor device of claim 9, wherein
the lower insertion film is in contact with the gate insulating film, and interposed between the lower conductive film and the gate insulating film.

11. The semiconductor device of claim 10, wherein an end portion of the lower insertion film is disposed on the top surface of the field insulating film.

12. A semiconductor device comprising:
a first active pattern disposed on a substrate, the first active pattern including a first lower pattern and first sheet patterns, which are separated from the first lower pattern;
a second active pattern disposed on the substrate, the second active pattern including a second lower pattern, which is adjacent to the first lower pattern, and second sheet patterns, which are separated from the second lower pattern;
a field insulating film disposed between, and in direct contact with, the first active pattern and the second active pattern; and
a gate structure surrounding the first sheet patterns and the second sheet patterns, on the field insulating film,
wherein
the gate structure includes a gate insulating film, which surrounds the first sheet patterns and the second sheet patterns, a lower conductive film, which is on the gate insulating film, an aluminum nitride film, which is on the lower conductive film, and an upper conductive film, which is on the aluminum nitride film,
the gate structure further includes a lower insertion film on the first active pattern, with the aluminum nitride film disposed between the lower insertion film and the upper conductive film and spaced apart from the lower insertion film on the first active pattern, the lower conductive film directly contacting the aluminum nitride film and the lower insertion film, and the lower insertion film including a nitride or an oxide of a metal having an electronegativity of about 1.5 or higher,
the lower conductive film surrounds the first sheet patterns, and is not formed along circumferences of the second sheet patterns,
the aluminum nitride film is in contact with the gate insulating film surrounding the second sheet patterns,
the upper conductive film is over the first sheet patterns, but not interposed between two adjacent ones of the first sheet patterns,
the upper conductive film is over the second sheet patterns, and interposed between two adjacent ones of the second sheet patterns,
the first active pattern is disposed in a p-type metal-oxide semiconductor (PMOS) region, and
the second active pattern is disposed in an n-type metal-oxide semiconductor (NMOS) region.

13. The semiconductor device of claim 12, wherein the aluminum nitride film is not formed in spaces between the first lower pattern and the first sheet patterns.

14. The semiconductor device of claim 12, wherein the lower insertion film is disposed between the gate insulating film and the lower conductive film, along circumferences of the first sheet patterns, and
the lower insertion film is not formed along the circumferences of the second sheet patterns.

15. The semiconductor device of claim 14, wherein the lower insertion film includes at least one of molybdenum oxide, molybdenum nitride, niobium oxide, niobium nitride, nickel oxide, tin oxide, or titanium oxide.

\* \* \* \* \*